United States Patent
Park et al.

(10) Patent No.: US 11,894,294 B2
(45) Date of Patent: Feb. 6, 2024

(54) DISPLAY APPARATUS INCLUDING A DISPLAY PANEL WITH MULTIPLE PADS

(71) Applicant: SAMSUNG DISPLAY CO., LTD., Yongin-si (KR)

(72) Inventors: Hanho Park, Yongin-si (KR); Jeongeun Park, Yongin-si (KR); Soyeon Joo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/804,271

(22) Filed: May 26, 2022

(65) Prior Publication Data

US 2023/0104777 A1 Apr. 6, 2023

(30) Foreign Application Priority Data

Oct. 1, 2021 (KR) ........................ 10-2021-0131134

(51) Int. Cl.
*H05K 1/18* (2006.01)
*H01L 23/498* (2006.01)
(Continued)

(52) U.S. Cl.
CPC .... *H01L 23/49838* (2013.01); *H01L 23/5386* (2013.01); *H05K 1/0268* (2013.01);
(Continued)

(58) Field of Classification Search
CPC .......... H01L 23/49838; H01L 23/5386; H05K 1/0268; H05K 1/118
(Continued)

(56) References Cited

U.S. PATENT DOCUMENTS 7,834,650 B2 11/2010 Kang et al.
2019/0310509 A1* 10/2019 Shin ..................... H01L 27/1255
(Continued)

FOREIGN PATENT DOCUMENTS

JP 2008151954 7/2008
KR 10-2007-0028002 3/2007
(Continued)

*Primary Examiner* — Binh B Tran
(74) *Attorney, Agent, or Firm* — F. CHAU & ASSOCIATES, LLC

(57) ABSTRACT

A display apparatus includes a printed circuit board including first to fourth output pad regions and a flexible circuit board having a first end connected to a display panel and a second end connected to the printed circuit board. The first output pad region includes a $1^{st}$-$1^{st}$ output pad group and a $1^{st}$-$2^{nd}$ output pad group, the second output pad region includes a $2^{nd}$-$1^{st}$ output pad group and a $2^{nd}$-$2^{nd}$ output pad group, the fourth output pad region includes a $4^{th}$-$1^{st}$ output pad group and a $4^{th}$-$2^{nd}$ output pad group, and the printed circuit board includes a first input terminal electrically connected to the $1^{st}$-$1^{st}$ output pad group, a second input terminal electrically connected to the $2^{nd}$-$2^{nd}$ output pad group, a third input terminal electrically connected to the first input terminal, and a fourth input terminal electrically connected to the $4^{th}$-$2^{nd}$ output pad group.

22 Claims, 12 Drawing Sheets

(51) Int. Cl.
*H05K 1/11* (2006.01)
*H05K 1/02* (2006.01)
*H05K 1/14* (2006.01)
*H01L 23/538* (2006.01)
*H01L 23/00* (2006.01)
*H01L 25/18* (2023.01)
*H10K 59/131* (2023.01)

(52) U.S. Cl.
CPC ............... *H05K 1/118* (2013.01); *H05K 1/14* (2013.01); *H05K 1/189* (2013.01); *H01L 23/4985* (2013.01); *H01L 23/5387* (2013.01); *H01L 24/06* (2013.01); *H01L 24/29* (2013.01); *H01L 24/32* (2013.01); *H01L 25/18* (2013.01); *H01L 2224/06152* (2013.01); *H01L 2224/06155* (2013.01); *H01L 2224/29006* (2013.01); *H01L 2224/29028* (2013.01); *H01L 2224/32227* (2013.01); *H05K 2201/09936* (2013.01); *H05K 2201/10128* (2013.01); *H10K 59/131* (2023.02)

(58) Field of Classification Search
USPC .......................................................... 361/749
See application file for complete search history.

(56) References Cited

U.S. PATENT DOCUMENTS

2020/0090567 A1* 3/2020 Lee ..................... G09G 3/3266
2022/0087026 A1 3/2022 Park et al.

FOREIGN PATENT DOCUMENTS

| KR | 10-2016076 | 10/2019 |
| KR | 10-2020-0117033 | 10/2020 |

* cited by examiner

DISPLAY APPARATUS INCLUDING A DISPLAY PANEL WITH MULTIPLE PADS

CROSS-REFERENCE TO RELATED APPLICATION

This application claims priority under 35 U.S.C. § 119 to Korean Patent Application No. 10-2021-0131134, filed on Oct. 1, 2021 in the Korean Intellectual Property Office, the disclosure of which is incorporated by reference herein in its entirety.

TECHNICAL FIELD

The present disclosure relates to a display apparatus, and more particularly, to a display apparatus including a display panel with multiple pads.

DISCUSSION OF THE RELATED ART

In general, a display apparatus includes a flexible circuit board. The flexible circuit board may electrically connect a display panel to a printed circuit board.

For this purpose, a pad provided on the flexible circuit board and a pad provided on the display panel may be electrically coupled to each other, and the pad provided on the flexible circuit board and a pad provided on the printed circuit board may be electrically coupled to each other. As the size of pads becomes smaller and the pitch between the pads decreases according to the high resolution of a display apparatus, the locations of the flexible circuit board and the display panel need to be more precise to be effectively coupled. Because the electrical coupling quality between the flexible circuit board and the display panel affects whether electrical signals are transmitted accurately, the electrical coupling quality between the flexible circuit board and the display panel may be tested.

SUMMARY

A display apparatus includes a display panel including a first input pad region, a second input pad region, a third input pad region, and a fourth input pad region, a printed circuit board including a first output pad region, a second output pad region, a third output pad region, and a fourth output pad region, and a flexible circuit board having a first end connected to the display panel and a second end connected to the printed circuit board. The first output pad region includes a $1^{st}$-$1^{st}$ output pad group and a $1^{st}$-$2^{nd}$ output pad group. Each of the $1^{st}$-$1^{st}$ output pad group and the $1^{st}$-$2^{nd}$ output pad group include a plurality of test pads. A test pad of the $1^{st}$-$1^{st}$ output pad group is connected to a test pad of the $1^{st}$-$2^{nd}$ output pad group. The second output pad region includes a $2^{nd}$-$1^{st}$ output pad group and a $2^{nd}$-$2^{nd}$ output pad group. Each of the $2^{nd}$-$1^{st}$ output pad group and the $2^{nd}$-$2^{nd}$ output pad group include a plurality of test pads. A test pad of the $2^{nd}$-$1^{st}$ output pad group is connected to a test pad of the $2^{nd}$-$2^{nd}$ output pad group. The third output pad region includes a $3^{rd}$-$1^{st}$ output pad group and a $3^{rd}$-$2^{nd}$ output pad group. Each of the $3^{rd}$-$1^{st}$ output pad group and the $3^{rd}$-$2^{nd}$ output pad group includes a plurality of test pads. A test pad of the $3^{rd}$-$1^{st}$ output pad group is connected to a test pad of the $3^{rd}$-$2^{nd}$ output pad group. The fourth output pad region includes a $4^{th}$-$1^{st}$ output pad group and a $4^{th}$-$2^{nd}$ output pad group. Each of the $4^{th}$-$1^{st}$ output pad group and the $4^{th}$-$2^{nd}$ output pad group includes a plurality of test pads. A test pad of the $4^{th}$-$1^{st}$ output pad group is connected to a test pad of the $4^{th}$-$2^{nd}$ output pad group. The printed circuit board includes a first input terminal electrically connected to the $1^{st}$-$1^{st}$ output pad group, a second input terminal electrically connected to the $2^{nd}$-$2^{nd}$ output pad group, a third input terminal electrically connected to the first input terminal, and a fourth input terminal electrically connected to the $4^{th}$-$2^{nd}$ output pad group.

A location of the first input terminal and a location of the second input terminal with respect to the first output pad region and the second output pad region may correspond to a location of the third input terminal and a location of the fourth input terminal with respect to the third output pad region and the fourth output pad region.

The third input terminal may be electrically connected to the first input terminal.

The second input terminal may be electrically connected to the $3^{rd}$-$1^{st}$ output pad group.

The third input terminal may be electrically connected to the first input terminal through a wire disposed on a layer that is different from a layer on which the third input terminal is disposed.

The second input terminal may be electrically connected to the $3^{rd}$-$1^{st}$ output pad group through a wire disposed on a layer that is different from a layer on which the second input terminal is disposed.

The first input terminal may be adjacent to the first output pad region, the second input terminal may be adjacent to the second output pad region, the third input terminal may be adjacent to the third output pad region, and the fourth input terminal may be adjacent to the fourth output pad region.

The first input terminal and the second input terminal may be adjacent to the second output pad region, and the third input terminal and the fourth input terminal may be adjacent to the fourth output pad region.

One test pad included in the $1^{st}$-$1^{st}$ output pad group may be connected to one test pad included in the $1^{st}$-$2^{nd}$ output pad group. Another test pad included in the $1^{st}$-$2^{nd}$ output pad group may be connected to one test pad included in the $2^{nd}$-$1^{st}$ output pad group. Another test pad included in the $2^{nd}$-$1^{st}$ output pad group may be connected to one test pad included in the $2^{nd}$-$2^{nd}$ output pad group. Another test pad included in the $2^{nd}$-$2^{nd}$ output pad group may be connected to one test pad included in the $3^{rd}$-$1^{st}$ output pad group. Another test pad included in the $3^{rd}$-$1^{st}$ output pad group may be connected to one test pad included in the $3^{rd}$-$2^{nd}$ output pad group. Another test pad included in the $3^{rd}$-$2^{nd}$ output pad group may be connected to one test pad included in the $4^{th}$-$1^{st}$ output pad group. Another test pad included in the $4^{th}$-$1^{st}$ output pad group may be connected to one test pad included in the $4^{th}$-$2^{nd}$ output pad group.

The display apparatus may further include $1^{st}$-$1^{st}$ test terminals connected to test pads included in the $1^{st}$-$1^{st}$ output pad group, $1^{st}$-$2^{nd}$ test terminals connected to test pads included in the $1^{st}$-$2^{nd}$ output pad group, $2^{nd}$-$1^{st}$ test terminals connected to test pads included in the $2^{nd}$-$1^{st}$ output pad group, $2^{nd}$-$2^{nd}$ test terminals connected to test pads included in the $2^{nd}$-$2^{nd}$ output pad group, $3^{rd}$-$1^{st}$ test terminals connected to test pads included in the $3^{rd}$-$1^{st}$ output pad group, $3^{rd}$-$2^{nd}$ test terminals connected to test pads included in the $3^{rd}$-$2^{nd}$ output pad group, $4^{th}$-$1^{st}$ test terminals connected to test pads included in the $4^{th}$-$1^{st}$ output pad group, and $4^{th}$-$2^{nd}$ test terminals connected to test pads included in the $4^{th}$-$2^{nd}$ output pad group.

The second input terminal may be connected to the test pad included in the $2^{nd}$-$2^{nd}$ output pad group and the test pad included in the $3^{rd}$-$1^{st}$ output pad group.

The flexible circuit board may include a first connection pattern electrically connecting the first output pad region to the first input pad region, a second connection pattern electrically connecting the second output pad region to the second input pad region, a third connection pattern electrically connecting the third output pad region to the third input pad region, and a fourth connection pattern electrically connecting the fourth output pad region to the fourth input pad region.

A display apparatus includes a display panel including a first input pad region, a second input pad region, a third input pad region, and a fourth input pad region, a printed circuit board including a first output pad region, a second output pad region, a third output pad region, and a fourth output pad region, and a flexible circuit board having a first end connected to the display panel and a second end connected to the printed circuit board. The first output pad region includes a $1^{st}$-$1^{st}$ output pad group and a $1^{st}$-$2^{nd}$ output pad group. Each of the $1^{st}$-$1^{st}$ output pad group and the $1^{st}$-$2^{nd}$ output pad group include a plurality of test pads. A test pad of the $1^{st}$-$1^{st}$ output pad group is connected to a test pad of the $1^{st}$-$2^{nd}$ output pad group. The second output pad region includes a $2^{nd}$-$1^{st}$ output pad group and a $2^{nd}$-$2^{nd}$ output pad group. Each of the $2^{nd}$-$1^{st}$ output pad group and the $2^{nd}$-$2^{nd}$ output pad group include a plurality of test pads. A test pad of the $2^{nd}$-$1^{st}$ output pad group is connected to a test pad of the $2^{nd}$-$2^{nd}$ output pad group. The third output pad region includes a $3^{rd}$-$1^{st}$ output pad group and a $3^{rd}$-$2^{nd}$ output pad group. Each of the $3^{rd}$-$1^{st}$ output pad group and the $3^{rd}$-$2^{nd}$ output pad group include a plurality of test pads. A test pad of the $3^{rd}$-$1^{st}$ output pad group is connected to a test pad of the $3^{rd}$-$2^{nd}$ output pad group. The fourth output pad region includes a $4^{th}$-$1^{st}$ output pad group and a $4^{th}$-$2^{nd}$ output pad group. Each of the $4^{th}$-$1^{st}$ output pad group and the $4^{th}$-$2^{nd}$ output pad group include a plurality of test pads. A test pad of the $4^{th}$-$1^{st}$ output pad group is connected to a test pad of the $4^{th}$-$2^{nd}$ output pad group. The printed circuit board includes a first input terminal and a second input terminal electrically connected to the $1^{st}$-$1^{st}$ output pad group, a third input terminal electrically connected to the first input terminal, and a fourth input terminal electrically connected to the $3^{rd}$-$1^{st}$ output pad group.

A location of the first input terminal and a location of the second input terminal with respect to the first output pad region may correspond to a location of the third input terminal and a location of the fourth input terminal with respect to the third output pad region, respectively.

The third input terminal may be electrically connected to the first input terminal through a wire disposed on a layer that is different from a layer on which the third input terminal is disposed.

The fourth input terminal may be electrically connected to the $3^{rd}$-$1^{st}$ output pad group through a wire disposed on a layer that is different from a layer on which the fourth input terminal is disposed.

The fourth input terminal may be electrically connected to the $2^{nd}$-$2^{nd}$ output pad group.

The first input terminal and the second input terminal may be adjacent to the first output pad region, and the third input terminal and the fourth input terminal may be adjacent to the third output pad region.

A test pad included in the $1^{st}$-$1^{st}$ output pad group may be connected to one test pad included in the $1^{st}$-$2^{nd}$ output pad group. A test pad included in the $1^{st}$-$2^{nd}$ output pad group may be connected to a test pad included in the $2^{nd}$-$1^{st}$ output pad group. A test pad included in the $2^{nd}$-$1^{st}$ output pad group may be connected to a test pad included in the $2^{nd}$-$2^{nd}$ output pad group. A test pad included in the $2^{nd}$-$2^{nd}$ output pad group may be connected to a test pad included in the $3^{rd}$-$1^{st}$ output pad group. A test pad included in the $3^{rd}$-$1^{st}$ output pad group may be connected to a test pad included in the $3^{rd}$-$2^{nd}$ output pad group. A test pad included in the $3^{rd}$-$2^{nd}$ output pad group may be connected to a test pad included in the $4^{th}$-$1^{st}$ output pad group. A test pad included in the $4^{th}$-$1^{st}$ output pad group may be connected to a test pad included in the $4^{th}$-$2^{nd}$ output pad group.

The printed circuit board may further include $1^{st}$-$1^{st}$ test terminals connected to test pads included in the $1^{st}$-$1^{st}$ output pad group, $1^{st}$-$2^{nd}$ test terminals connected to test pads included in the $1^{st}$-$2^{nd}$ output pad group, $2^{nd}$-$1^{st}$ test terminals connected to test pads included in the $2^{nd}$-$1^{st}$ output pad group, $2^{nd}$-$2^{nd}$ test terminals connected to test pads included in the $2^{nd}$-$2^{nd}$ output pad group, $3^{rd}$-$1^{st}$ test terminals connected to test pads included in the $3^{rd}$-$1^{st}$ output pad group, $3^{rd}$-$2^{nd}$ test terminals connected to test pads included in the $3^{rd}$-$2^{nd}$ output pad group, $4^{th}$-$1^{st}$ test terminals connected to test pads included in the $4^{th}$-$1^{st}$ output pad group, and $4^{th}$-$2^{nd}$ test terminals connected to test pads included in the $4^{th}$-$2^{nd}$ output pad group.

The second input terminal may be connected to the test pad included in the $2^{nd}$-$2^{nd}$ output pad group and the test pad included in the $3^{rd}$-$1^{st}$ output pad group.

The flexible circuit board may include a first connection pattern electrically connecting the first output pad region to the first input pad region, a second connection pattern electrically connecting the second output pad region to the second input pad region, a third connection pattern electrically connecting the third output pad region to the third input pad region, and a fourth connection pattern electrically connecting the fourth output pad region to the fourth input pad region.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
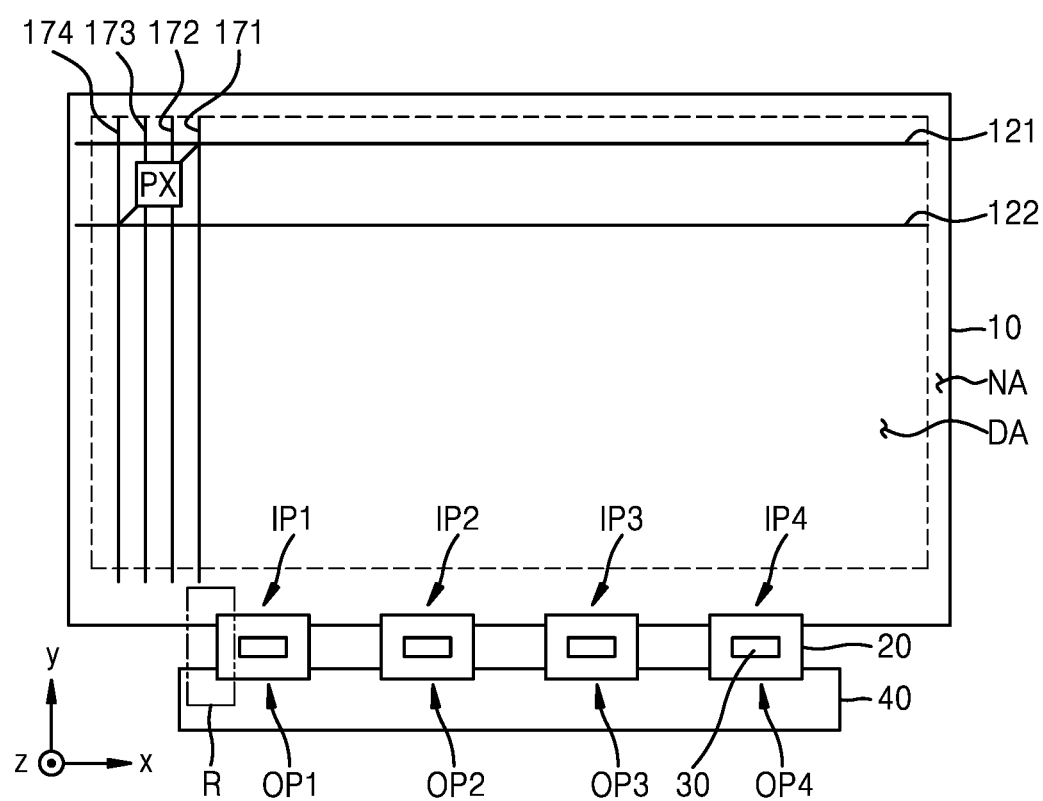
FIG. 1 is a plan view of a display apparatus according to an embodiment of the present disclosure.

Reference will now be made in detail to various embodiments of the present disclosure, examples of which are illustrated in the accompanying drawings, wherein like reference numerals may refer to like elements throughout the specification and the drawings. In this regard, the present embodiments may have different forms and should not necessarily be construed as being limited to the descriptions set forth herein. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since the disclosure may have diverse modified embodiments, certain embodiments are illustrated in the drawings and are described in the detailed description. Elements and features of the disclosure, and implementation methods thereof will be clarified through following embodiments described with reference to the accompanying drawings. The disclosure may, however, be embodied in many different forms and should not necessarily be construed as limited to the embodiments set forth herein.

It will be understood that when a layer, region, or component is referred to as being "formed on" another layer, region, or component, it can be directly or indirectly formed on the other layer, region, or component. For example, intervening layers, regions, or components may be present. Sizes of components in the drawings may be exaggerated for convenience of explanation.

In the following embodiments of the present disclosure, an x-axis, a y-axis, and a z-axis are not necessarily limited to three axes on an orthogonal coordinate system and may be widely understood. For example, the x-axis, the y-axis, and the z-axis may be perpendicular to one another or may represent different directions that are not perpendicular to one another.

FIG. 1 is a plan view of a display apparatus according to an embodiment of the present disclosure.

Referring to FIG. 1, the display apparatus may include a display panel 10, a flexible circuit board 20, and a printed circuit board 40. In addition to this, the display apparatus may further include various components, for example, an integrated circuit chip 30.

The display panel 10 includes a display area DA and a non-display area NA. The display area DA is a portion where an image is displayed, and the non-display area NA around the display area DA is a portion in which circuits and/or signal lines for generating and/or transmitting various signals applied to the display area DA are disposed. The non-display area NA may at least partially surround the display area DA. In FIG. 1, a boundary between the display area DA and the non-display area NA is indicated by dashed lines.

Pixels PX may be disposed in the display area DA of the display panel 10. Signal lines such as a first scan line 121, a second scan line 122, a data line 171, a driving voltage line 172, a common voltage line 173, and/or an initialization voltage line 174 may be disposed in the display area DA.

The first scan line 121 and the second scan line 122 may extend in approximately a first direction (x-axis direction). The data line 171, the driving voltage line 172, the common voltage line 173, and the initialization voltage line 174 may extend in approximately a second direction (y-axis direction). The second direction may intersect the first direction. However, the disclosure is not necessarily limited thereto. For example, at least one of the driving voltage line 172, the common voltage line 173, and the initialization voltage line 174 may include a portion extending in the first direction (x-axis direction) and a portion extending in the second direction (y-axis direction), and may have a mesh shape.

Each pixel PX may be connected to the first scan line 121, the second scan line 122, the data line 171, the driving voltage line 172, the common voltage line 173, and/or the initialization voltage line 174, and may receive a first scan signal, a second scan signal, a data voltage, a driving voltage, a common voltage, and/or an initialization voltage from these signal lines. The pixel PX may include a light emitting element such as a light-emitting diode.

Touch electrodes are disposed in the display area DA of the display panel 10 to sense a touch of a user's finger or the like.

A first input pad region IP1, a second input pad region IP2, a third input pad region IP3, and a fourth input pad region IP4 on which input pads to which signals are input from the outside are disposed may be located in the non-display area NA of the display panel 10. Hereinafter, the first input pad region, IP1, the second input pad region IP2, the third input pad region IP3, and the fourth input pad region IP4 are also referred to as the first input pad unit IP1, the second input pad unit IP2, the third input pad unit IP3, and the fourth input pad unit IP4. The first input pad region IP1, the second input pad region IP2, the third input pad region IP3, and the fourth input pad region IP4 may be spaced apart from each other along one edge (in a −y direction) of the display panel 10.

A first end of the flexible circuit board 20 may be connected to the first input pad region IP1, the second input pad region IP2, the third input pad region IP3, and the fourth input pad region IP4. Accordingly, first transfer pads located at the first end of the flexible circuit board 20 may be electrically connected to input pads of the display panel 10. Because the first input pad region IP1, the second input pad region IP2, the third input pad region IP3, and the fourth input pad region IP4 are spaced apart from each other, a first end of a corresponding flexible circuit board 20 may be connected to each of the first input pad region IP1, the second input pad region IP2, the third input pad region IP3, and the fourth input pad region IP4. However, if necessary, one flexible circuit board 20 may be connected to the first input pad region IP1, the second input pad region IP2, the third input pad region IP3, and the fourth input pad region IP4.

A driver that generates and/or processes various signals for driving the display panel 10 may be located in the non-display area NA of the display panel 10. The driver may include a data driver for applying a data signal to the data line 171, a gate driver for applying a gate signal to the first scan line 121 and the second scan line 122, and a signal control unit for controlling the data driver and the gate driver. A data signal or the like may be applied to the pixels PX at certain timing according to a scan signal generated by the gate-driver.

The gate-driver may be integrated in the display panel 10 and may be located on at least one side of the display area DA. The data-driver may have the same shape as that of an integrated circuit chip 30. The integrated circuit chip 30 may be mounted on the flexible circuit board 20. Signals output from the integrated circuit chip 30 may be transferred to the display panel 10 through first transfer pads of the flexible circuit board 20 and input pads of the display panel 10.

The display apparatus may include a plurality of integrated circuit chips 30, and one integrated circuit chip 30 may be mounted on each of flexible circuit boards 20. The integrated circuit chip 30 may be mounted in the non-display area NA of the display panel 10. In this case, the integrated circuit chip 30 may be disposed between the first input pad unit IP1, the second input pad unit IP2, the third input pad unit IP3, and the fourth input pad unit IP4 and the display area DA.

A first output pad unit OP1, a second output pad unit OP2, a third output pad unit OP3, and a fourth output pad unit OP4 may be spaced apart from each other on one edge (in the +y direction) of the printed circuit board 40. A second end of the flexible circuit board 20 is a portion opposite to the first end of the flexible circuit board 20, and the first output pad unit OP1, the second output pad unit OP2, the third output pad unit OP3, and the fourth output pad unit OP4 of the printed circuit board 40 may be connected to the second end of the flexible circuit board 20. Accordingly, second transfer pads located at the second end of the flexible circuit board 20 may be electrically connected to test pads of the printed circuit board 40.

Because the first output pad unit OP1, the second output pad unit OP2, the third output pad unit OP3, and the fourth output pad unit OP4 are spaced apart from each other, a second end of a corresponding flexible circuit board 20 may be connected to each of the first output pad unit OP1, the second output pad unit OP2, the third output pad unit OP3, and the fourth output pad unit OP4. However, if necessary, one flexible circuit board 20 may be connected to the first output pad unit OP1, the second output pad unit OP2, the third output pad unit OP3, and the fourth output pad unit OP4.

Each of the first transfer pads located at the first end of the flexible circuit board 20 may be electrically connected to a corresponding second transfer pad located at the second end of the printed circuit board 20. Accordingly, the flexible circuit board 20 may include a first connection pattern for electrically connecting the first output pad unit OP1 to the first input pad unit IP1. Similarly, the flexible circuit board 20 may include a second connection pattern for electrically connecting the second output pad unit OP2 to the second input pad unit IP2. In addition, the flexible circuit board 20 may include a third connection pattern for electrically connecting the third output pad unit OP3 to the third input pad unit IP3. Similarly, the flexible circuit board 20 may include a fourth connection pattern for electrically connecting the fourth output pad unit OP4 to the fourth input pad unit IP4.

As described above, the integrated circuit chip 30 may output signals provided to the display area DA. For example, the integrated circuit chip 30 may output a data voltage, a driving voltage, a common voltage and/or an initialization voltage, and the like. In the non-display area NA, a data voltage transmission line, a driving voltage transmission line, a common voltage transmission line and/or an initialization voltage transmission line for respectively transmitting the data voltage, the driving voltage, the common voltage and/or the initialization voltage output from the integrated circuit chip 30 to the data line 171, the driving voltage line 172, the common voltage line 173 and/or the initialization voltage line 174 of the display area DA may be located. The integrated circuit chip 30 may also output signals for controlling the gate-driver.

The integrated circuit chip 30 may receive signals (e.g., image data and related signals or power, etc.) that are a basis for generating the above signals from the printed circuit board 40. For example, signals from the printed circuit board 40 may be transmitted to the integrated circuit chip 30 through output pads of the printed circuit board 40 and second transfer pads of the flexible circuit board 20.

A processor and/or memory may be located on the printed circuit board 40. For example, when a display apparatus is applied to a mobile communication terminal, the processor may be an application processor including a central processing unit, a graphics-processing unit, and/or a modem. The flexible circuit board 20 may be bent, and accordingly, the printed circuit board 40 may be located on a rear surface (in a −z direction) of the display panel 10.

Figure 2:
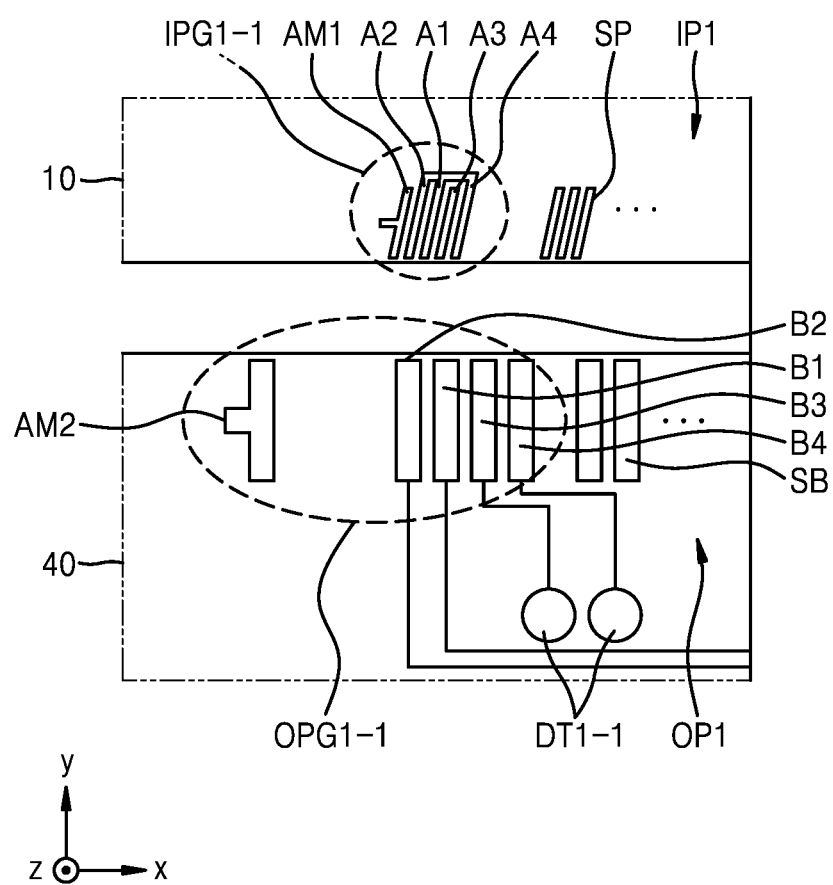
FIG. 2 is an enlarged view excluding a flexible circuit board in portion "R" of FIG. 1.
Figure 3:
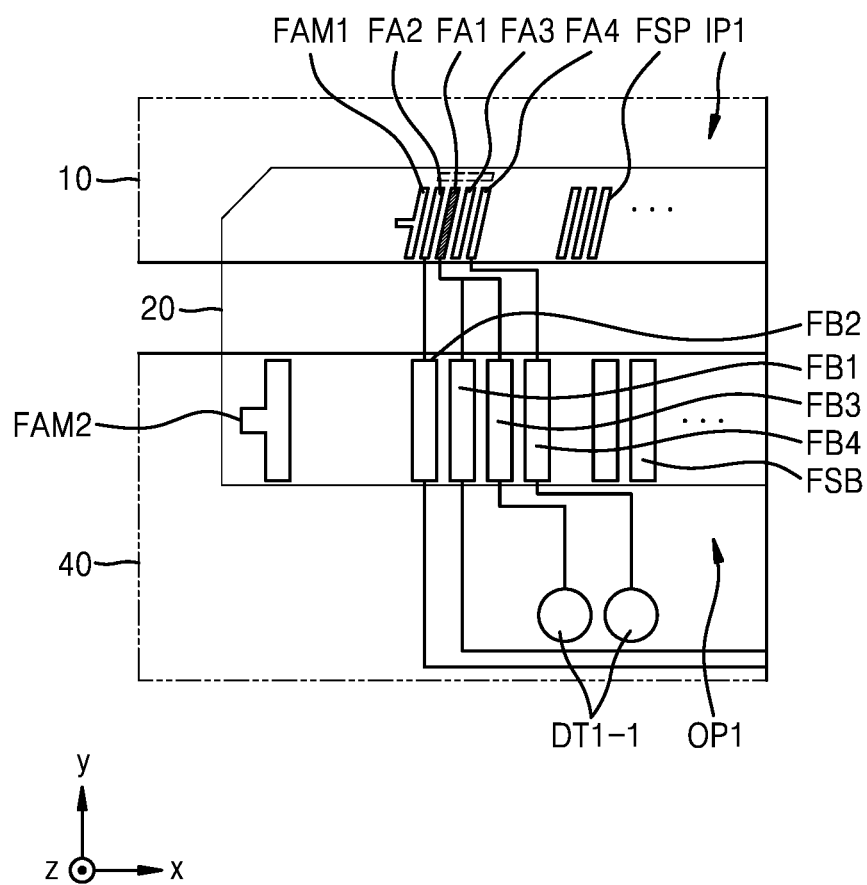
FIG. 3 is an enlarged view of portion "R" of FIG. 1.
Figure 4:
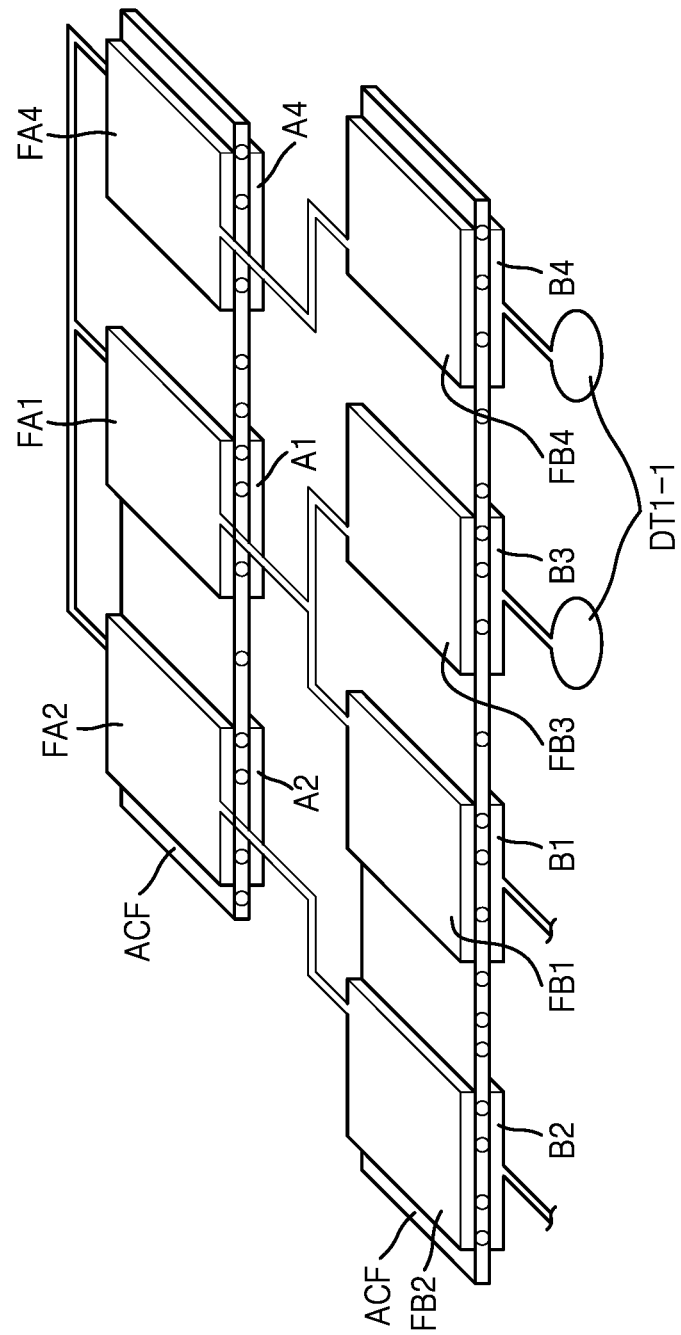
FIG. 4 is a conceptual diagram of 4-terminal connection resistance measurement.

FIG. 2 is an enlarged view excluding the flexible circuit board 20 in portion "R" of FIG. 1, and FIG. 3 is an enlarged view of portion "R" of FIG. 1. FIG. 4 is a conceptual diagram of 4-terminal connection resistance measurement.

The first output pad unit OP1 on the printed circuit board 40 includes a $1^{st}$-$1^{st}$ output pad group OPG1-1 and a $1^{st}$-$2^{nd}$ output pad group OPG1-2 (see FIG. 5) each including a plurality of test pads. A first test pad B1 of the $1^{st}$-$1^{st}$ output pad group OPG1-1 is connected to a fifth test pad B5 (see FIG. 5) of the $1^{st}$-$2^{nd}$ output pad group OPG1-2. A second test pad B2 of the $1^{st}$-$1^{st}$ output pad group OPG1-1 is connected to a first input terminal IT1 (see FIG. 5). Accordingly, the $1^{st}$-$1^{st}$ output pad group OPG1-1 is electrically connected to the first input terminal IT1. A third test pad B3 of the $1^{st}$-$1^{st}$ output pad group OPG1-1 is connected to one $1^{st}$-$1^{st}$ test terminal DT1-1, a fourth test pad B4 of the $1^{st}$-$1^{st}$ output pad group OPG1-1 is connected to the $1^{st}$-$1^{st}$ test terminal DT1-1.

The first input pad unit IP1 on the display panel 10 also includes a $1^{st}$-$1^{st}$ input pad group IPG1-1 and a $1^{st}$-$2^{nd}$ input pad group IPG1-2 (see FIG. 5) each including a plurality of input pads.

The $1^{st}$-$1^{st}$ input pad group IPG1-1 may include a first alignment mark AM1, and the $1^{st}$-$1^{st}$ output pad group OPG1-1 may include a second alignment mark AM2. When electrically coupling the first end of the flexible circuit board 20 to the display panel 10, by matching a first alignment mark FAM1 of the flexible circuit board 20 with the first alignment mark AM1 of the display panel 10, the first end of the flexible circuit board 20 and the display panel 10 may be electrically coupled at an accurate location. In addition, when electrically coupling the second end of the flexible circuit board 20 to the printed circuit board 40, by matching a second alignment mark FAM2 of the flexible circuit board 20 with the second alignment mark AM2 of the printed circuit board 40, the second end of the flexible circuit board 20 and the printed circuit board 40 may be electrically coupled at an accurate location.

In FIGS. 3 and 4, the flexible circuit board 20 includes a $1^{st}$-$1^{st}$ transfer pad FA1, a $1^{st}$-$2^{nd}$ transfer pad FA2, and a $1^{st}$-$4^{th}$ transfer pad FA4 as first transfer pads, and includes a $2^{nd}$-$1^{st}$ transfer pad FB1, a $2^{nd}$-$2^{nd}$ transfer pad FB2, a $2^{nd}$-$3^{rd}$ transfer pad FB3, and a $2^{nd}$-$4^{th}$ transfer pad FB4 as second transfer pads.

The first test pad B1 of the $1^{st}$-$1^{st}$ output pad group OPG1-1 is electrically connected to the $2^{nd}$-$1^{st}$ transfer pad FB1 of the flexible circuit board 20, and the third test pad B3 of the $1^{st}$-$1^{st}$ output pad group OPG1-1 is electrically connected to the $2^{nd}$-$3^{rd}$ transfer pad FB3 of the flexible circuit board 20. The $1^{st}$-$1^{st}$ transfer pad FA1 of the flexible circuit board 20 connected to the $2^{nd}$-$1^{st}$ transfer pad FB1 and the $2^{nd}$-$3^{rd}$ transfer pad FB3 through a wire of the flexible circuit board 20 is electrically connected to a first input pad A1 of the $1^{st}$-$1^{st}$ input pad group IPG1-1. The second test pad B2 of the $1^{st}$-$1^{st}$ output pad group OPG1-1 is electrically connected to the $2^{nd}$-$2^{nd}$ transfer pad FB2 of the flexible circuit board 20, and the $1^{st}$-$2^{nd}$ transfer pad FA2 of the flexible circuit board 20 connected to the $2^{nd}$-$2^{nd}$ transfer pad FB2 through the wire of the flexible circuit board 20 is electrically connected to a second input pad A2 of the $1^{st}$-$1^{st}$ input pad group IPG1-1. The fourth test pad B4 of the $1^{st}$-$1^{st}$ output pad group OPG1-1 is electrically connected to the 2-4 transfer pad FB4 of the flexible circuit board 20, and the $1^{st}$-$4^{th}$ transfer pad FA4 of the flexible circuit board 20 connected to the 2-4 transfer pad FB4 through the wire of the flexible circuit board 20 is electrically connected to a fourth input pad A4 of the $1^{st}$-$1^{st}$ input pad group IPG1-1. The first input pad A1, the second input pad A2, and the fourth input pad A4 are connected to each other and may be an integral metal pattern. A $1^{st}$-$3^{rd}$ transfer pad FA3 of the flexible circuit board 20 is electrically connected to a third input pad A3 of the $1^{st}$-$1^{st}$ input pad group IPG1-1, wherein the third input pad A3 may be a dummy pad.

Input pads of the $1^{st}$-$1^{st}$ input pad group IPG1-1 of the display panel 10 and the first transfer pads of the flexible circuit board 20 may be electrically connected to each other by an anisotropic conductive film ACF as shown in FIG. 4. Similarly, test pads of the $1^{st}$-$1^{st}$ output pad group OPG1-1 of the printed circuit board 40 and the second transfer pads of the flexible circuit board 20 may be electrically connected to each other by the anisotropic conductive film ACF.

The test pads of the $1^{st}$-$1^{st}$ output pad group OPG1-1 of the printed circuit board 40 may be electrically connected to the input pads of the $1^{st}$-$1^{st}$ input pad group IPG1-1 of the display panel 10 through the flexible circuit board 20 in this way. This also applies to the $1^{st}$-$2^{nd}$ output pad group OPG1-2 and the $1^{st}$-$2^{nd}$ input pad group IPG1-2 (see FIG. 5).

An input pad such as a signal input pad SP (see FIG. 2) is also present in the display panel 10, and an output pad such as a signal output pad SB (see FIG. 2) is also present in the printed circuit board 40. The signal input pad SP may be electrically connected to a first signal transfer pad FSP (see FIG. 3) of the flexible circuit board 20. The signal output pad SB may be electrically connected to a second signal transfer pad FSB (see FIG. 3) of the flexible circuit board 20. The first signal transfer pad FSP and the second signal transfer pad FSB may be electrically connected to the integrated circuit chip 30 on the flexible circuit board 20, which is omitted in FIG. 3 for convenience. Accordingly, the signal output pad SB of the printed circuit board 40 may be electrically connected to the integrated circuit chip 30, and the integrated circuit chip 30 may be electrically connected to the signal input pad SP of the display panel 10. A signal from the signal input pad SP may be applied to the data line 171 of the display panel 10 or the like.

By such connection, a connection resistance measuring circuit may be formed. Measured connection resistance is connection resistance between the first input pad A1 of the display panel 10 and the $1^{st}$-$1^{st}$ transfer pad FA1 of the flexible circuit board 20.

For example, when a current I is applied by electrically connecting a current source to the first test pad B1 and the second test pad B2, and a voltage V is measured by connecting a voltmeter to the $1^{st}$-$1^{st}$ test terminal DT1-1 connected to the third test pad B3 and the $1^{st}$-$1^{st}$ test terminal DT1-1 connected to the fourth test pad B4, connection resistance R may be calculated by V/I. In this way, when connection resistance is measured using a total of four terminals including two terminals electrically connected to the first test pad B1 and the second test pad B2 and two $1^{st}$-$1^{st}$ test terminals DT1-1, compared to a method of measuring two-terminal loop resistance, the influence on wire resistance may be excluded or reduced, so that the connection resistance may be measured more accurately.

When it is evaluated that the first input pad A1 of the $1^{st}$-$1^{st}$ input pad group IPG1-1 of the display panel 10 and the $1^{st}$-$1^{st}$ transfer pad FA1 of the flexible circuit board 20 are well connected to each other by a such a process, and similarly, when it is evaluated that one input pad of the $1^{st}$-$2^{nd}$ input pad group IPG1-2 of the display panel 10 and one transfer pad of the flexible circuit board 20 are well connected to each other by a similar method, it can be considered that the signal input pad SP between the $1^{st}$-$1^{st}$ input pad group IPG1-1 and the $1^{st}$-$2^{nd}$ input pad group IPG1-2 is well connected to the first signal transfer pad FSP of the flexible circuit board 20.

Figure 5:
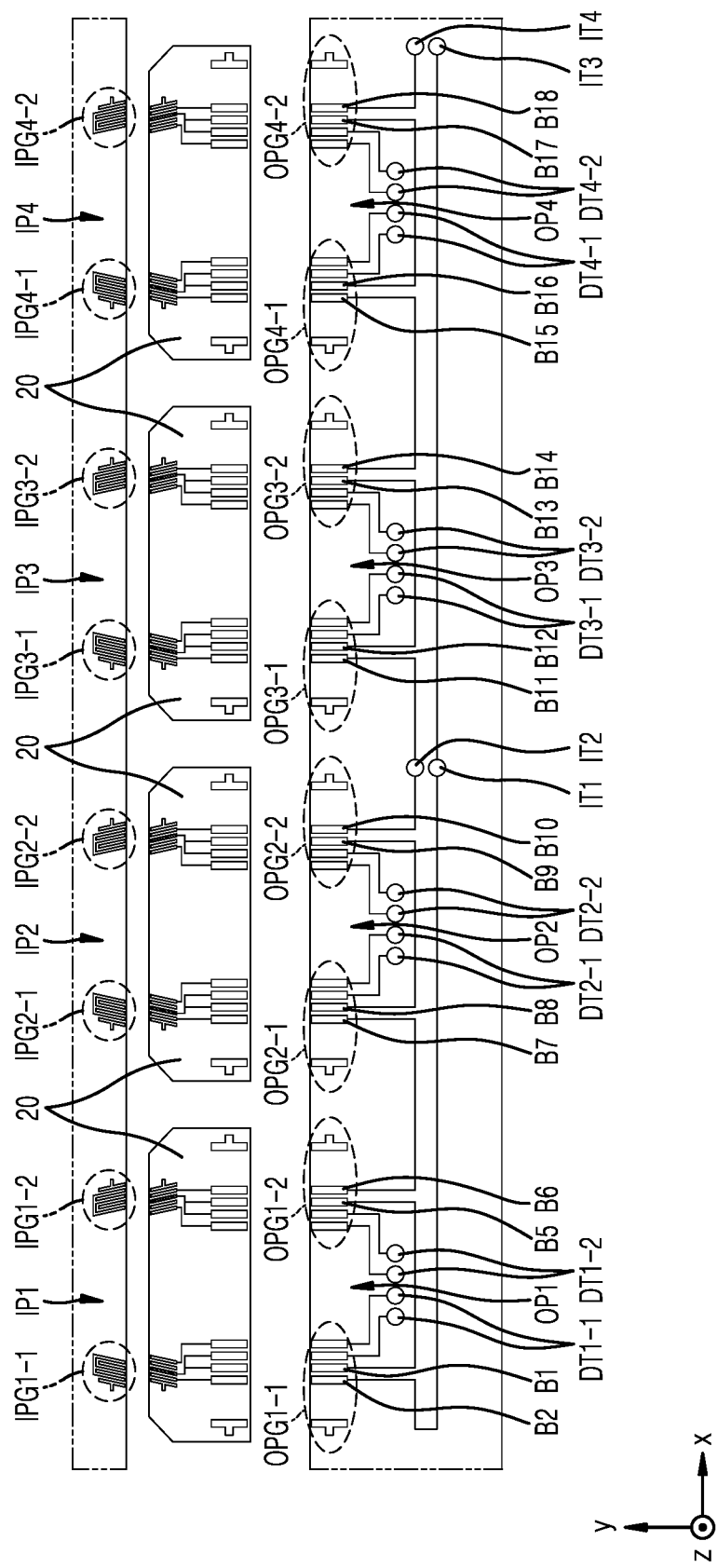
FIG. 5 is an exploded plan view of a portion of the display apparatus of FIG. 1.

FIG. 5 is an exploded plan view of a portion of the display apparatus of FIG. 1. In FIG. 5, four flexible circuit boards 20 are illustrated, and for convenience, they are illustrated as being separated from the display panel 10 and the printed circuit board 40. In FIG. 5, only a portion (in the −y direction) of the display panel 10 is illustrated for convenience, and the integrated circuit chip 30, the signal input pad SP, the first signal transfer pad FSP, the second signal transfer pad FSB, and the signal output pad SB are omitted.

Each flexible circuit board 20 has a first end connected to the display panel 10 and a second end connected to the printed circuit board 40. As described above, the first input pad unit IP1, the second input pad unit IP2, the third input pad unit IP3, and the fourth input pad unit IP4 may be spaced apart from each other along one edge (in the −y direction) of the display panel 10. The first end of each of the flexible circuit boards 20 is connected to a corresponding one of the first input pad unit IP1, the second input pad unit IP2, the third input pad unit IP3, and the fourth input pad unit IP4.

The first input pad unit IP1 may include the $1^{st}$-$1^{st}$ input pad group IPG1-1 having the same configuration as described above and the $1^{st}$-$2^{nd}$ input pad group IPG1-2 that is mirror-symmetrical with the $1^{st}$-$1^{st}$ input pad group IPG1-1 (with respect to the y-axis). The second input pad unit IP2 may include a $2^{nd}$-$1^{st}$ input pad group IPG2-1 and a $2^{nd}$-$2^{nd}$ input pad group IPG2-2 having a configuration similar to that of the first input pad unit IP1. The third input pad unit IP3 may also include a $3^{rd}$-$1^{st}$ input pad group IPG3-1 and a $3^{rd}$-$2^{nd}$ input pad group IPG3-2 having a configuration similar to that of the first input pad unit IP1. The fourth input pad unit IP4 may also include a $4^{th}$-$1^{st}$ input pad group IPG4-1 and a $4^{th}$-$2^{nd}$ input pad group IPG4-2 having a configuration similar to that of the first input pad unit IP1.

On the printed circuit board 40, as described above, the first output pad unit OP1, the second output pad unit OP2, the third output pad unit OP3, and the fourth output pad unit OP4 are apart from each other on one edge of the printed circuit board 40 (in a +y direction). The first output pad unit OP1 may include the $1^{st}$-$1^{st}$ output pad group OPG1-1 having the same configuration as described above, and the $1^{st}$-$2^{nd}$ output pad group OPG1-2 that is mirror-symmetrical with the $1^{st}$-$1^{st}$ output pad group OPG1-1 (with respect to the y-axis). At this time, the first test pad B1 of the $1^{st}$-$1^{st}$ output pad group OPG1-1 is connected to the fifth test pad B5 of the $1^{st}$-$2^{nd}$ output pad group OPG1-2 through a wire on the printed circuit board 40. For example, the first test pad B1, the fifth test pad B5, and a wire connecting them may be an integral metal pattern.

The second output pad unit OP2 may include a $2^{nd}$-$1^{st}$ output pad group OPG2-1 and a $2^{nd}$-$2^{nd}$ output pad group OPG2-2 having a configuration similar to that of the first output pad unit OP1. The third output pad unit OP3 may also include a $3^{rd}$-$1^{st}$ output pad group OPG3-1 and a $3^{rd}$-$2^{nd}$ output pad group OPG3-2 having a configuration similar to that of the first output pad unit OP1, and the fourth output pad unit OP4 may also include a $4^{th}$-$1^{st}$ output pad group OPG4-1 and a $4^{th}$-$2^{nd}$ output pad group OPG4-2 having a configuration similar to that of the first output pad unit OP1. Accordingly, an eighth test pad B8 from among test pads of the $2^{nd}$-$1^{st}$ output pad group OPG2-1 is connected to a ninth test pad B9 from among test pads of the $2^{nd}$-$2^{nd}$ output pad group OPG2-2. In addition, a twelfth test pad B12 from among test pads of the $3^{rd}$-$1^{st}$ output pad group OPG3-1 is connected to a 13th test pad B13 from among the test pads of the $3^{rd}$-$2^{nd}$ output pad group OPG3-2, and a 16th test pad B16 from among the test pads of the $4^{th}$-$1^{st}$ output pad group OPG4-1 is connected to a 17th test pad B17 from among the test pads of the $4^{th}$-$2^{nd}$ output pad group OPG4-2.

However, as shown in FIG. 5, a sixth test pad B6 from among the test pads of the $1^{st}$-2nd output pad group OPG1-2 is connected to a seventh test pad B7 from among the test pads of the $2^{nd}$-$1^{st}$ output pad group OPG2-1, a tenth test pad B10 from among the test pads of the $2^{nd}$-$2^{nd}$ output pad group OPG2-2 is connected to an eleventh test pad B11 from among the test pads of the $3^{rd}$-$1^{st}$ output pad group OPG3-1, and a 14th test pad B14 from among the test pads of the $3^{rd}$-$2^{nd}$ output pad group OPG3-2 is connected to a 15th test pad B15 from among the test pads of the $4^{th}$-$1^{st}$ output pad group OPG4-1.

As described above, the second test pad B2 of the $1^{st}$-$1^{st}$ output pad group OPG1-1 is connected to the first input terminal IT1. The second test pad B2, the first input terminal IT1, and a wire connecting them may be an integral metal pattern. Accordingly, the $1^{st}$-$1^{st}$ output pad group OPG1-1 is electrically connected to the first input terminal IT1. In addition, the tenth test pad B10 of the $2^{nd}$-$2^{nd}$ output pad group OPG2-2 and the eleventh test pad B11 of the $3^{rd}$-$1^{st}$ output pad group OPG3-1 are connected to a second input terminal IT2. Accordingly, the $2^{nd}$-$2^{nd}$ output pad group OPG2-2 and the $3^{rd}$-$1^{st}$ output pad group OPG3-1 are electrically connected to the second input terminal IT2. The tenth test pad B10, the eleventh test pad B11, the second input terminal IT2, and wires connecting them may be an integral metal pattern.

However, a third input terminal IT3 is electrically connected to the first input terminal IT1. The first input terminal IT1, the third input terminal IT3, and a wire connecting them may be an integral metal pattern. In addition, an 18th test pad B18 of the $4^{th}$-$2^{nd}$ output pad group OPG4-2 is connected to a fourth input terminal IT4. Accordingly, the $4^{th}$-$2^{nd}$ output pad group OPG4-2 is electrically connected to the fourth input terminal IT4. The 18th test pad B18, the fourth input terminal IT4, and a wire connecting them may be an integral metal pattern.

The third test pad B3 of the $1^{st}$-$1^{st}$ output pad group OPG1-1 is connected to a $1^{st}$-$1^{st}$ test terminal DT1-1, and the fourth test pad B4 of the $1^{st}$-$1^{st}$ output pad group OPG1-1 is connected to another $1^{st}$-$1^{st}$ test terminal DT1-1. Similarly, one test pad from among the test pads of the $1^{st}$-$2^{nd}$ output pad group OPG1-2 is connected to one $1^{st}$-$2^{nd}$ test terminal DT1-2, and another test pad from among the test pads of the $1^{st}$-$2^{nd}$ output pad group OPG1-2 is connected to another $1^{st}$-$2^{nd}$ test terminal DT1-2. The two $1^{st}$-$1^{st}$ test terminals DT1-1 and the two $1^{st}$-$2^{nd}$ test terminals DT1-2 may be adjacent to each other.

When it is evaluated that one input pad of the $1^{st}$-$1^{st}$ input pad group IPG1-1 and one transfer pad of the flexible circuit board 20 are well connected to each other through the two $1^{st}$-$1^{st}$ test terminals DT1-1, and one input pad of the $1^{st}$-$2^{nd}$ input pad group IPG1-2 and one transfer pad of the flexible circuit board 20 are well connected to each other through the two $1^{st}$-$2^{nd}$ test terminals DT1-2, it can be considered that the signal input pad SP between the $1^{st}$-$1^{st}$ input pad group IPG1-1 and the $1^{st}$-$2^{nd}$ input pad group IPG1-2 is well connected to the first signal transfer pad FSP of the flexible circuit board 20.

Similarly, one test pad from among the test pads of the $2^{nd}$-$1^{st}$ output pad group OPG2-1 is connected to one $2^{nd}$-$1^{st}$ test terminal DT2-1, and another test pad from among the test pads of the $2^{nd}$-$1^{st}$ output pad group OPG2-1 is connected to another $2^{nd}$-$1^{st}$ test terminal DT2-1. Similarly, one test pad from among the test pads of the $2^{nd}$-$2^{nd}$ output pad group OPG2-2 is connected to one $2^{nd}$-$2^{nd}$ test terminal DT2-2, and another test pad from among the test pads of the $2^{nd}$-$2^{nd}$ output pad group OPG2-2 is connected to another $2^{nd}$-$2^{nd}$ test terminal DT2-2. The two $2^{nd}$-$1^{st}$ test terminals DT2-1 and the two $2^{nd}$-$2^{nd}$ test terminals DT2-2 may be adjacent to each other.

When it is evaluated that one input pad of the $2^{nd}$-$1^{st}$ input pad group IPG2-1 and one transfer pad of the flexible circuit board 20 are well connected to each other through the two $2^{nd}$-$1^{st}$ test terminals DT2-1, and one input pad of the $2^{nd}$-$2^{nd}$ input pad group IPG2-2 and one transfer pad of the flexible circuit board 20 are well connected to each other through the two $2^{nd}$-$2^{nd}$ test terminals DT2-2, it can be considered that a signal input pad between the $2^{nd}$-$1^{st}$ input pad group IPG2-1 and the $2^{nd}$-$2^{nd}$ input pad group IPG2-2 is well connected to a first signal transfer pad of the flexible circuit board 20.

Similarly, one test pad from among the test pads of the $3^{rd}$-$1^{st}$ output pad group OPG3-1 is connected to one $3^{rd}$-$1^{st}$ test terminal DT3-1, and another test pad from among the test pads of the $3^{rd}$-$1^{st}$ output pad group OPG3-1 is connected to another $3^{rd}$-$1^{st}$ test terminal DT3-1. Similarly, one test pad from among the test pads of the $3^{rd}$-$2^{nd}$ output pad group OPG3-2 is connected to one $3^{rd}$-$2^{nd}$ test terminal DT3-2, and another test pad from among the test pads of the $3^{rd}$-$2^{nd}$ output pad group OPG3-2 is connected to another $3^{rd}$-$2^{nd}$ test terminal DT3-2. The two $3^{rd}$-$1^{st}$ test terminals DT3-1 and the two $3^{rd}$-$2^{nd}$ test terminals DT3-2 may be adjacent to each other.

When it is evaluated that one input pad of the $3^{rd}$-$1^{st}$ input pad group IPG3-1 and one transfer pad of the flexible circuit board 20 are well connected to each other through the two $3^{rd}$-$1^{st}$ test terminals DT3-1, and one input pad of the $3^{rd}$-$2^{nd}$ input pad group IPG3-2 and one transfer pad of the flexible circuit board 20 are well connected to each other through the two $3^{rd}$-$2^{nd}$ test terminals DT3-2, it can be considered that a signal input pad between the $3^{rd}$-$1^{st}$ input pad group IPG3-1 and the $3^{rd}$-$2^{nd}$ input pad group IPG3-2 is well connected to the first signal transfer pad of the flexible circuit board 20.

Similarly, one test pad from among the test pads of the $4^{th}$-$1^{st}$ output pad group OPG4-1 is connected to one $4^{th}$-$1^{st}$ test terminal DT4-1, and another test pad from among the test pads of the $4^{th}$-$1^{st}$ output pad group OPG4-1 is connected to another $4^{th}$-$1^{st}$ test terminal DT4-1. Similarly, one test pad from among the test pads of the $4^{th}$-$2^{nd}$ output pad group OPG4-2 is connected to one $4^{th}$-$2^{nd}$ test terminal DT4-2, and another test pad from among the test pads of the $4^{th}$-$2^{nd}$ output pad group OPG4-2 is connected to another $4^{th}$-$2^{nd}$ test terminal DT4-2. The two $4^{th}$-$1^{st}$ test terminals DT4-1 and the two $4^{th}$-$2^{nd}$ test terminals DT4-2 may be adjacent to each other.

When it is evaluated that one input pad of the $4^{th}$-$1^{st}$ input pad group IPG4-1 and one transfer pad of the flexible circuit board 20 are well connected to each other through the two $4^{th}$-$1^{st}$ test terminals DT4-1, and one input pad of the $4^{th}$-$2^{nd}$ input pad group IPG4-2 and one transfer pad of the flexible circuit board 20 are well connected to each other through the two $4^{th}$-$2^{nd}$ test terminals DT4-2, it can be considered that a signal input pad between the $4^{th}$-$1^{st}$ input pad group IPG4-1 and the $4^{th}$-$2^{nd}$ input pad group IPG4-2 is well connected to the first signal transfer pad of the flexible circuit board 20.

In order to determine whether the connection is good using the two $1^{st}$-$1^{st}$ test terminals DT1-1 as described above, the current I is applied by electrically connecting a current source to the first test pad B1 and the second test pad B2, and a voltmeter is connected to the two $1^{st}$-$1^{st}$ test terminals DT1-1 to measure the voltage V.

As described above, the second test pad B2 is connected to the first input terminal IT1. The first test pad B1 is connected to the fifth test pad B5, the fifth test pad B5 is electrically connected to the sixth test pad B6 through pads and wires of the flexible circuit board 20 and the $1^{st}$-$2^{nd}$ input pad group IPG1-2 of the display panel 10, the sixth test pad B6 is connected to the seventh test pad B7, the seventh test pad B7 is electrically connected to the eighth test pad B8 through the pads and wires of the flexible circuit board 20 and the $2^{nd}$-$1^{st}$ input pad group IPG2-1 of the display panel 10, the eighth test pad B8 is connected to the ninth test pad B9, the ninth test pad B9 is electrically connected to the tenth test pad B10 through pads and wires of the flexible circuit board 20 and the $2^{nd}$-$2^{nd}$ input pad group IPG2-2 of the display panel 10, and the tenth test pad B10 is connected to the second input terminal IT2. Accordingly, when the current I is applied by electrically connecting a current source to the first input terminal IT1 and the second input terminal IT2, this leads to a result of applying the current I by electrically connecting a current source to the first test pad B1 and the second test pad B2, so the two $1^{st}$-$1^{st}$ test terminals DT1-1 may be used to determine whether the connection is good.

In the same way, by the electrical connection relationship as described above, in a state in which the current I is applied by electrically connecting a current source to the first input terminal IT1 and the second input terminal IT2, the two $1^{st}$-$2^{nd}$ test terminals DT1-2 may be used to determine whether the connection is good. In the same way, by the electrical connection relationship as described above, in a state in which the current I is applied by electrically connecting a current source to the first input terminal IT1 and the second input terminal IT2, the two $2^{nd}$-$1^{st}$ test terminals DT2-1 may be used to determine whether the connection is good. In the same way, by the electrical connection relationship as described above, in a state in which the current I is applied by electrically connecting a current source to the first input terminal IT1 and the second input terminal IT2, the two $2^{nd}$-$2^{nd}$ test terminals DT2-2 may be used to determine whether the connection is good.

In order to determine whether the connection is good using the two $3^{rd}$-$1^{st}$ test terminals DT3-1, the current I is applied by electrically connecting a current source to the eleventh test pad B11 and the twelfth test pad B12, and a voltmeter is connected to the $3^{rd}$-$1^{st}$ test terminals DT3-1 to measure the voltage V.

The eleventh test pad B11 is electrically connected to the third input terminal IT3 through the tenth test pad B10, the $2^{nd}$-$2^{nd}$ input pad group IPG2-2, the ninth test pad B9, the eighth test pad B8, the $2^{nd}$-$1^{st}$ input pad group IPG2-1, the seventh test pad B7, the sixth test pad B6, the $1^{st}$-$2^{nd}$ input pad group IPG1-2, the fifth test pad B5, the first test pad B1, the $1^{st}$-$1^{st}$ input pad group IPG1-1, the second test pad B2, and the first input terminal IT1. In addition, the twelfth test pad B12 is electrically connected to the fourth input terminal IT4 through the 13th test pad B13, the $3^{rd}$-$2^{nd}$ input pad group IPG3-2, the 14th test pad B14, the 15th test pad B15, the $4^{th}$-$1^{st}$ input pad group IPG4-1, the 16th test pad B16, the 17th test pad B17, the $4^{th}$-$2^{nd}$ input pad group IPG4-2, and the 18th test pad B18. Accordingly, when the current I is applied by electrically connecting a current source to the third input terminal IT3 and the fourth input terminal IT4, this leads to a result of applying the current I by electrically connecting a current source to the eleventh test pad B11 and the twelfth test pad B12, so the two $3^{rd}$-$1^{st}$ test terminals DT3-1 may be used to determine whether the connection is good.

In the same way, by the electrical connection relationship as described above, in a state in which the current I is applied by electrically connecting a current source to the third input terminal IT3 and the fourth input terminal IT4, the two $3^{rd}$-$2^{nd}$ test terminals DT3-2 may be used to determine whether the connection is good. In the same way, by the electrical connection relationship as described above, in a state in which the current I is applied by electrically connecting a current source to the third input terminal IT3 and the fourth input terminal IT4, the two $4^{th}$-$1^{st}$ test terminals DT4-1 may be used to determine whether the connection is good. In the same way, by the electrical connection relationship as described above, in a state in which the current I is applied by electrically connecting a current source to the third input terminal IT3 and the fourth input terminal IT4, the two $4^{th}$-$2^{nd}$ test terminals DT4-2 may be used to determine whether the connection is good.

Figure 6:
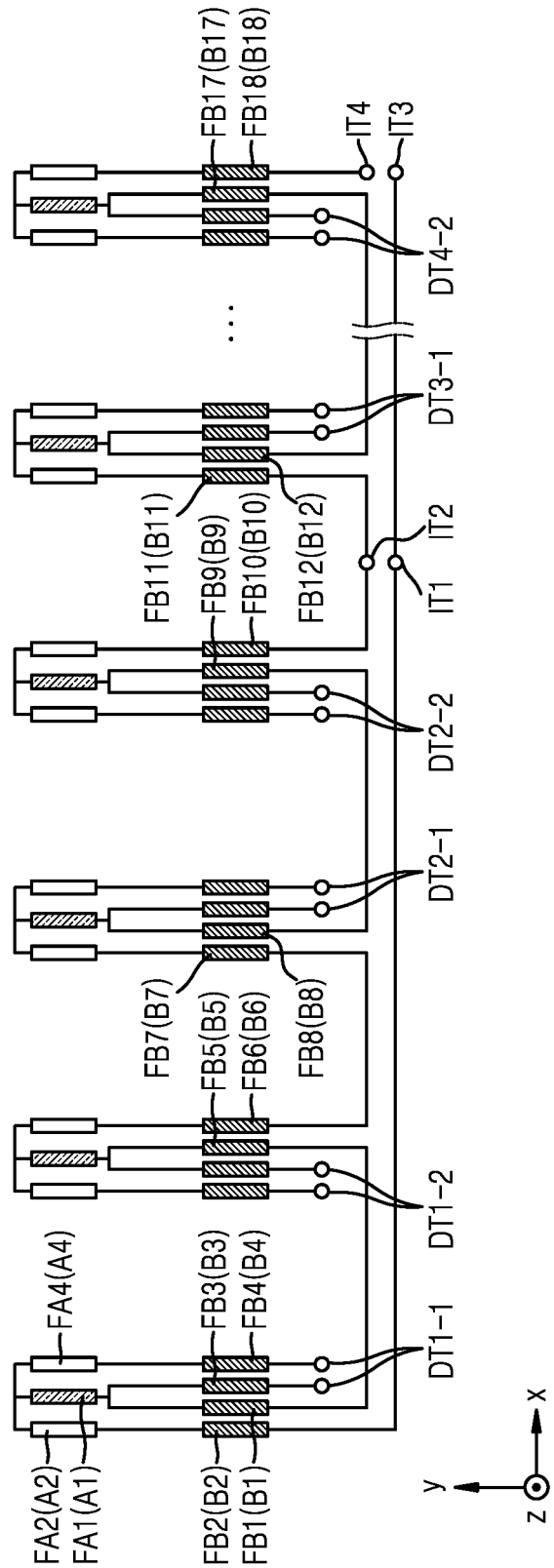
FIG. 6 is a conceptual diagram illustrating a connection relationship between components related to connection resistance measurement in the display apparatus shown in FIG. 5.
Figure 7:
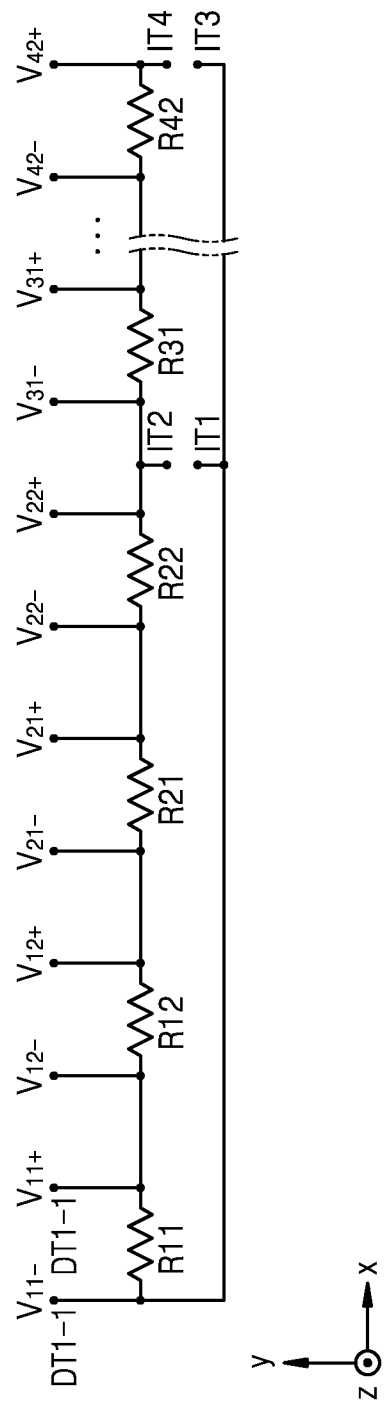
FIG. 7 is an equivalent circuit diagram of the conceptual diagram of FIG. 6.

FIG. 6 is a conceptual diagram illustrating a connection relationship between components related to connection resistance measurement in the display apparatus shown in FIG. 5, and FIG. 7 is an equivalent circuit diagram of the conceptual diagram of FIG. 6.

For example, when four flexible circuit boards 20 are coupled to the display panel 10, test pads as shown in FIG. 5 may be electrically connected to each other as shown in FIG. 6. Connection resistance between the first input pad A1 and the $1^{st}$-$1^{st}$ transfer pad FA1 may be represented by R11 as in the circuit diagram of FIG. 7, and connection resistance in the $1^{st}$-$2^{nd}$ input pad group IPG1-2 and the connection resistance in the $2^{nd}$-$1^{st}$ input pad group IPG2-1 may also be represented by R12, R21, and the like.

In a state in which a current is applied by connecting a current source to the first input terminal IT1 and the second input terminal IT2, a voltmeter is connected to each of $1^{st}$-$1^{st}$ test terminals DT1-1, $1^{st}$-$2^{nd}$ test terminals DT1-2, $2^{nd}$-$1^{st}$ test terminals DT2-1, and $2^{nd}$-$2^{nd}$ test terminals DT2-2 to measure a voltage, and R11, R12, R21, and R22, which are corresponding connection resistances, may be calculated. Similarly, in a state in which a current is applied by connecting a current source to the third input terminal IT3 and the fourth input terminal IT4, a voltmeter is connected to each of $3^{rd}$-$1^{st}$ test terminals DT3-1, $3^{rd}$-$2^{nd}$ test terminals DT3-2, $4^{th}$-$1^{st}$ test terminals DT4-1, and $4^{th}$-$2^{nd}$ test terminals DT4-2 to measure a voltage, and R31, R32, R41, and R42, which are corresponding connection resistances, may be calculated.

Figure 8:
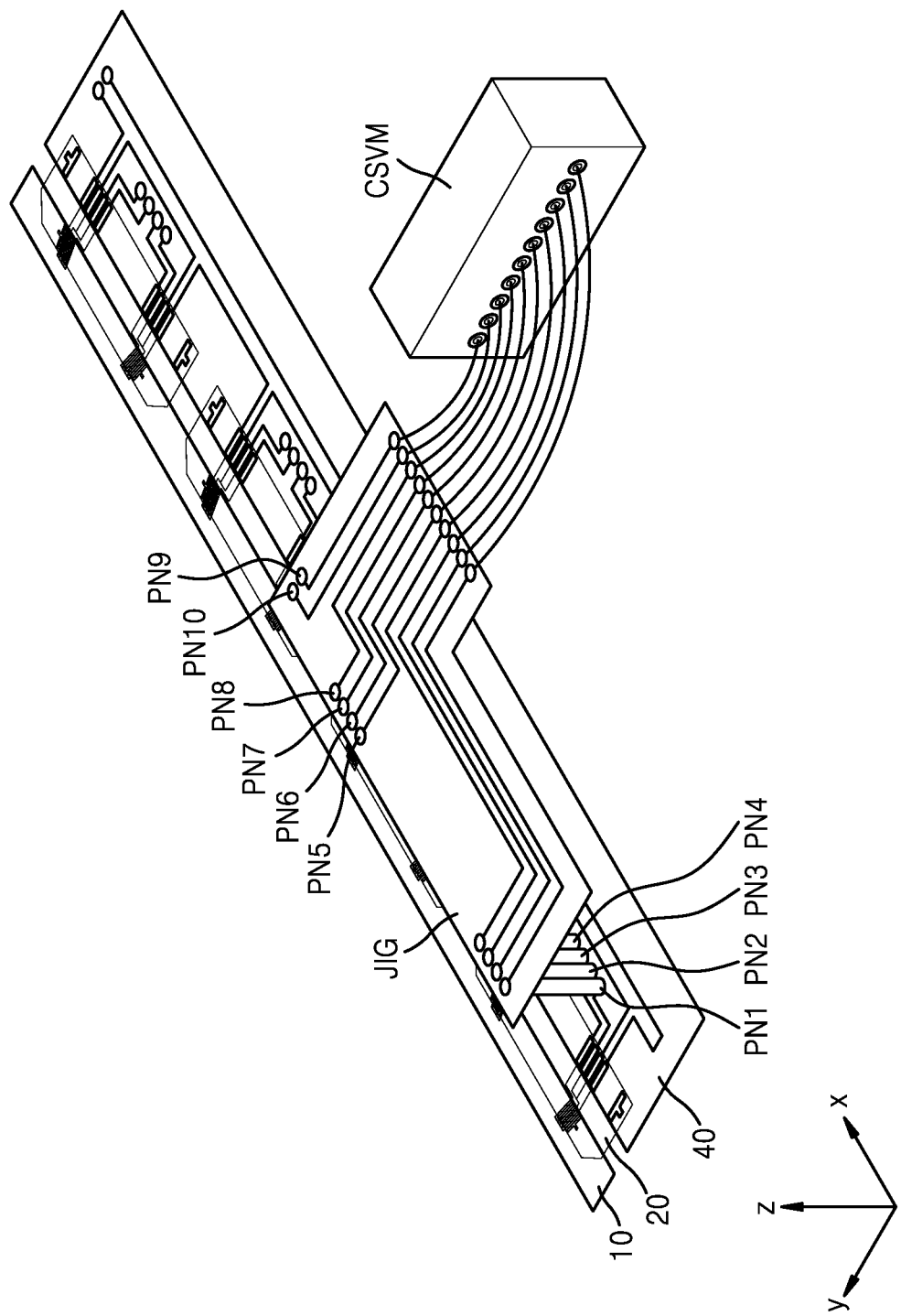
FIG. 8 is a conceptual diagram illustrating measurement of connection resistance in the display apparatus shown in FIG. 5.

FIG. 8 is a conceptual diagram illustrating measurement of connection resistance in the display apparatus shown in FIG. 5. For example, in FIG. 8, 4-terminal measurement is performed using a single current source voltmeter CSVM. The current source voltmeter CSVM is connected to one connection jig JIG, and the connection jig JIG has ten terminals PN1 to PN10. The first terminal PN1, the second terminal PN2, the third terminal PN3, and the fourth terminal PN4 of the connection jig JIG contact $1^{st}$-$1^{st}$ test terminals DT1-1 and $1^{st}$-$2^{nd}$ test terminals DT1-2 of the printed circuit board 40, the fifth terminal PN5, the sixth terminal PN6, the seventh terminal PN7, and the eighth terminal PN8 of the connection jig JIG contact $2^{nd}$-$1^{st}$ test terminals DT2-1 and $2^{nd}$-$2^{nd}$ test terminals DT2-2 of the printed circuit board 40, and the ninth terminal PN9 and the tenth terminal PN10 of the connection jig JIG contact the first input terminal IT1 and the second input terminal IT2 of the printed circuit board 40.

In the state in which the connection jig JIG is connected to the printed circuit board 40 in this way, by applying currents to the first input terminal IT1 and the second input terminal IT2 of the printed circuit board 40 from the $9^{th}$ terminal PN9 and the tenth terminal PN10 of the connection jig JIG, and measuring voltages at the remaining terminals of the connection jig JIG, connection resistances at four locations of the flexible circuit board 20 may be simultaneously measured.

Thereafter, after moving the display apparatus in a-x direction or moving the connection jig JIG in a +x direction, the first terminal PN1, the second terminal PN2, the third terminal PN3, and the fourth terminal PN4 of the connection jig JIG contact $3^{rd}$-$1^{st}$ test terminals DT3-1 and $3^{rd}$-$2^{nd}$ test terminals DT3-2 of the printed circuit board 40, the fifth terminal PN5, the sixth terminal PN6, the seventh terminal PN7, and the eighth terminal PN8 of the connection jig JIG contact $4^{th}$-$1^{st}$ test terminals DT4-1 and $4^{th}$-$2^{nd}$ test terminals DT4-2 of the printed circuit board 40, and the ninth terminal PN9 and the tenth terminal PN10 of the connection jig JIG contact the third input terminal IT3 and the fourth input terminal IT4 of the printed circuit board 40.

In the state in which the connection jig JIG is connected to the printed circuit board 40 in this way, by applying currents to the third input terminal IT3 and the fourth input terminal IT4 of the printed circuit board 40 from the $9^{th}$ terminal PN9 and the tenth terminal PN10 of the connection jig JIG, and measuring voltages at the remaining terminals of the connection jig JIG, connection resistances at four locations of the flexible circuit board 20 may be simultaneously measured.

For this purpose, the location of the first input terminal IT1 and the location of the second input terminal IT2 with respect to the first output pad unit OP1 and the second output pad unit OP2 may correspond to the location of the third input terminal IT3 and the location of the fourth input terminal IT4 with respect to the third output pad unit OP3 and the fourth output pad unit OP4, respectively. This may be done to measure connection resistances while relatively moving the connection jig JIG and the display apparatus using one connection jig JIG. For example, one connection jig JIG moves only up and down (in a z-axis direction) in place and the display apparatus moves in the +x direction a plurality of times, so that connection resistances in several flexible circuit boards 20 may be effectively measured. As a result, the time required for measuring the connection resistance may be reduced and the difficulty required for measuring the connection resistance may be reduced.

For reference, FIG. 8 shows that the integrated current source voltmeter CSVM is used, but the disclosure is not necessarily limited thereto. For example, separate current sources and voltmeters may be used. However, even in this case, one connection jig JIG may include a plurality of input terminals connected to separate current sources and voltmeters, so that efficient measurement of connection resistance may be achieved.

In addition, in the case of the display apparatus according to the present embodiment, the number of terminals required to measure connection resistances of two flexible circuit boards 20 is ten. For typical 4-terminal measurement, the number of terminals required to measure connection resistances in one flexible circuit board is eight, as four terminals for measuring two voltages to derive two connection resistances and four terminals for current source connection corresponding to these four terminals are required. Therefore, in the case of typical 4-terminal measurement, the number of terminals required to measure connection resistances of two flexible circuit boards reaches 16.

However, in the case of the display apparatus according to the present embodiment, the number of terminals required to measure connection resistances of the two flexible circuit boards 20 may be greatly reduced to 10. Accordingly, by reducing the space occupied by these terminals on the printed circuit board 40, restrictions on the design and arrangement of test pads may be reduced, and the printed circuit board 40 may be miniaturized.

Figure 9:
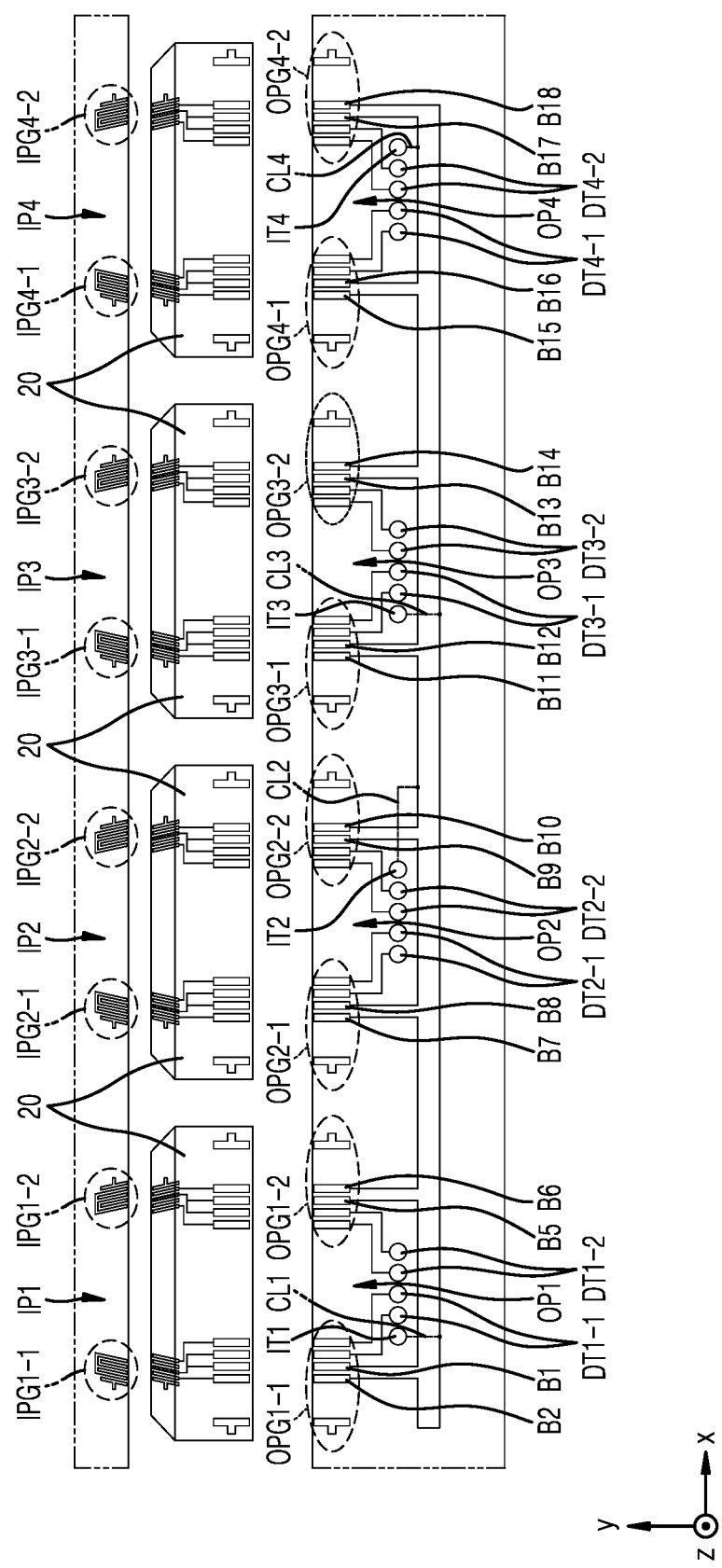
FIG. 9 is an exploded plan view of a portion of a display apparatus according to an embodiment of the present disclosure.

FIG. 9 is an exploded plan view of a portion of a display apparatus according to an embodiment of the present disclosure.

A difference between the display apparatus according to the present embodiment and the display apparatus according to the embodiment described above with reference to FIG. 5 is locations of the first input terminal IT1, the second input terminal IT2, the third input terminal IT3, and the fourth input terminal IT4 and connection relationship with other wires. In addition, as shown in FIG. 9, the second test pad B2 and the eighteenth test pad B18 are connected to each other. For example, the second test pad B2 and the eighteenth test pad B18 may be an integral metal pattern.

As shown in FIG. 9, in the case of the display apparatus according to the present embodiment, the first input terminal IT1 is adjacent to one side (in the −x direction) of the $1^{st}$-$1^{st}$ test terminal DT1-1. For example, the first input terminal IT1 is adjacent to the first output pad unit OP1. In addition, the second input terminal IT2 is adjacent to one side (in the +x direction) of the $2^{nd}$-$2^{nd}$ test terminal DT2-2. For example, the second input terminal IT2 is adjacent to the second output pad unit OP2. The third input terminal IT3 is adjacent to one side (in the −x direction) of the $3^{rd}$-$1^{st}$ test terminal DT3-1. For example, the third input terminal IT3 is adjacent to the third output pad unit OP3. In addition, the fourth input terminal IT4 is adjacent to one side (in the +x direction) of the $4^{th}$-$2^{nd}$ test terminal DT4-2. For example, the fourth input terminal IT4 is adjacent to the fourth output pad unit OP4.

The first input terminal IT1 is electrically connected to the second test pad B2 through a first connection wire CL1, wherein the first connection wire CL1 may cross a wire connecting the first test pad B1 to the fifth test pad B5 and may be disposed on a layer that is different from a layer on which the wire connecting the first test pad B1 to the fifth test pad B5 is disposed, and may be connected to a wire connected to the second test pad B2 through a contact hole. The first input terminal IT1 and the first connection wire CL1 may also be connected to each other through a contact hole. The second input terminal IT2 is electrically connected to the tenth test pad B10 and the eleventh test pad B11 through a second connection wire CL2. For example, the second input terminal IT2 is electrically connected to a wire connecting the tenth test pad B10 to the eleventh test pad B11 through the second connecting wire CL2. The second connection wire CL2 may be disposed on a layer that is different from a layer on which a wire connecting the eighth test pad B8 to the ninth test pad B9 is disposed, cross the wire connecting the eighth test pad B8 to the ninth test pad B9, and be connected, through a contact hole, to a wire connecting the tenth test pad B10 to the eleventh test pad B11. Accordingly, the second input terminal IT2 is electrically connected to the $3^{rd}$-$1^{st}$ output pad group OPG3-1. The second input terminal IT2 and the second connection wire CL2 may also be connected to each other through a contact hole.

The third input terminal IT3 is electrically connected to the second test pad B2 through a third connection wire CL3, wherein the third connection wire CL3 may be disposed on a layer that is different from a layer on which a wire connecting the twelfth test pad B12 to the 13th test pad B13 is disposed, cross the wire connecting the twelfth test pad B12 to the 13th test pad B13, and be connected, through a contact hole, to a wire connected to the second test pad B2. Accordingly, the third input terminal IT3 may be electrically connected to the first input terminal IT1. The third input terminal IT3 may be disposed on a layer that is different from a layer on which the third connection wire CL3 is disposed, and be connected to the third connection wire CL3 through a contact hole. The fourth input terminal IT4 is electrically connected to the seventeenth test pad B17 through a fourth connection wire CL4. For example, the fourth input terminal IT4, the sixteenth test pad B16, and the seventeenth test pad B17 may be an integral metal pattern.

Even in the case of the display apparatus according to the present embodiment as described above, the location of the first input terminal IT1 and the location of the second input terminal IT2 with respect to the first output pad unit OP1 and the second output pad unit OP2 may correspond to the location of the third input terminal IT3 and the location of the fourth input terminal IT4 with respect to the third output pad unit OP3 and the fourth output pad unit OP4, respectively. Accordingly, connection resistances may be measured while relatively moving the connection jig and the display apparatus using one connection jig JIG. In this case, one connection jig JIG moves only up and down (in the z-axis direction) in place and the display apparatus moves in the +x direction a plurality of times, so that connection resistances in several flexible circuit boards 20 may be effectively measured. As a result, the time required for measuring the connection resistance may be reduced and the difficulty required for measuring the connection resistance may be reduced. However, in this case, arrangement of ten terminals of the connection jig JIG corresponds to locations of the $1^{st}$-$1^{st}$ test terminals DT1-1, the $1^{st}$-$2^{nd}$ test terminals DT1-2, the first input terminal IT1 and the second input terminal IT2 as shown in FIG. 9, and thus may be different from that shown in FIG. 8.

Figure 10:
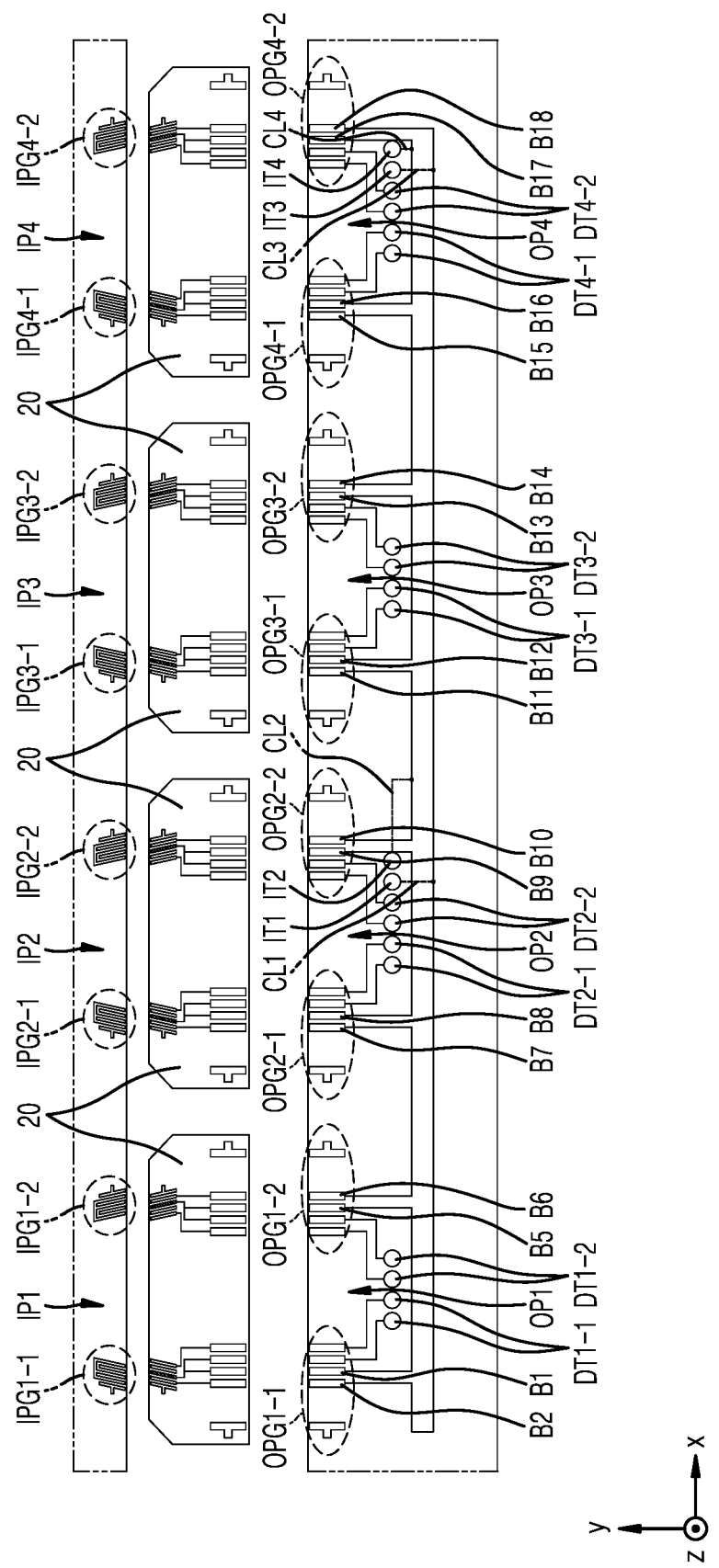
FIG. 10 is an exploded plan view of a portion of a display apparatus according to an embodiment of the present disclosure.

FIG. 10 is an exploded plan view of a portion of a display apparatus according to an embodiment of the present disclosure. A difference between the display apparatus according to the present embodiment and the display apparatus according to the embodiment described above with reference to FIG. 5 is locations of the first input terminal IT1, the second input terminal IT2, the third input terminal IT3, and the fourth input terminal IT4 and connection relationship with other wires. In addition, as shown in FIG. 10, the second test pad B2 and the eighteenth test pad B18 are connected to each other. For example, the second test pad B2 and the eighteenth test pad B18 may be an integral metal pattern.

As shown in FIG. 10, in the case of the display apparatus according to the present embodiment, the first input terminal IT1 and the second input terminal IT2 are adjacent to one side (in the +x direction) of the $2^{nd}$-$2^{nd}$ test terminal DT2-2. For example, the first input terminal IT1 and the second input terminal IT2 are adjacent to the second output pad unit OP2. The third input terminal IT3 and the fourth input terminal IT4 are adjacent to one side (in the +x direction) of the $4^{th}$-$2^{nd}$ test terminal DT4-2. For example, the third input terminal IT3 and the fourth input terminal IT4 are adjacent to the fourth output pad unit OP4.

The first input terminal IT1 is electrically connected to the second test pad B2 through the first connection wire CL1, wherein the first connection wire CL1 may be disposed on a layer that is different from a layer on which a wire connecting the eighth test pad B8 to the ninth test pad B9 is disposed, cross the wire connecting the eighth test pad B8 to the ninth test pad B9, and be connected, through a contact hole, to a wire connected to the second test pad B2. The first input terminal IT1 and the first connection wire CL1 may also be connected to each other through a contact hole. The second input terminal IT2 is electrically connected to the tenth test pad B10 and the eleventh test pad B11 through a second connection wire CL2. For example, the second input terminal IT2 is electrically connected to a wire connecting the tenth test pad B10 to the eleventh test pad B11 through the second connecting wire CL2. The second connection wire CL2 may be disposed on a layer that is different from a layer on which a wire connecting the eighth test pad B8 to the ninth test pad B9 is disposed, cross the wire connecting the eighth test pad B8 to the ninth test pad B9, and be connected, through a contact hole, to a wire connecting the tenth test pad B10 to the eleventh test pad B11. Accordingly, the second input terminal IT2 is electrically connected to the $3^{rd}$-$1^{st}$ output pad group OPG3-1. The second input terminal IT2 and the second connection wire CL2 may also be connected to each other through a contact hole.

The third input terminal IT3 is electrically connected to the second test pad B2 through the third connection wire CL3, wherein the third connection wire CL3 may be disposed on a layer that is different from a layer on which a wire connecting the 16th test pad B16 to the 17th test pad B17 is disposed, cross the wire connecting the 16th test pad B16 to the 17th test pad B17, and be connected, through a contact hole, to a wire connected to the second test pad B2. Accordingly, the third input terminal IT3 may be electrically connected to the first input terminal IT1. The third input terminal IT3 and the third connection wire CL3 may also be connected to each other through a contact hole. The fourth input terminal IT4 is electrically connected to the seventeenth test pad B17 through a fourth connection wire CL4. For example, the fourth input terminal IT4, the sixteenth test pad B16, and the seventeenth test pad B17 may be an integral metal pattern.

Even in the case of the display apparatus according to the present embodiment as described above, the location of the first input terminal IT1 and the location of the second input terminal IT2 with respect to the first output pad unit OP1 and the second output pad unit OP2 may correspond to the location of the third input terminal IT3 and the location of the fourth input terminal IT4 with respect to the third output pad unit OP3 and the fourth output pad unit OP4, respectively. Accordingly, connection resistances may be measured while relatively moving the connection jig and the display apparatus using one connection jig JIG. In this case, one connection jig JIG moves only up and down (in the z-axis direction) in place and the display apparatus moves in the +x direction a plurality of times, so that connection resistances in several flexible circuit boards 20 may be effectively measured. As a result, the time required for measuring the connection resistance may be reduced and the difficulty required for measuring the connection resistance may be reduced. However, in this case, arrangement of ten terminals of the connection jig JIG corresponds to locations of the $1^{st}$-$1^{st}$ test terminals DT1-1, the $1^{st}$-$2^{nd}$ test terminals DT1-2, the first input terminal IT1 and the second input terminal IT2 as shown in FIG. 10, and thus may be different from that shown in FIG. 8.

Figure 11:
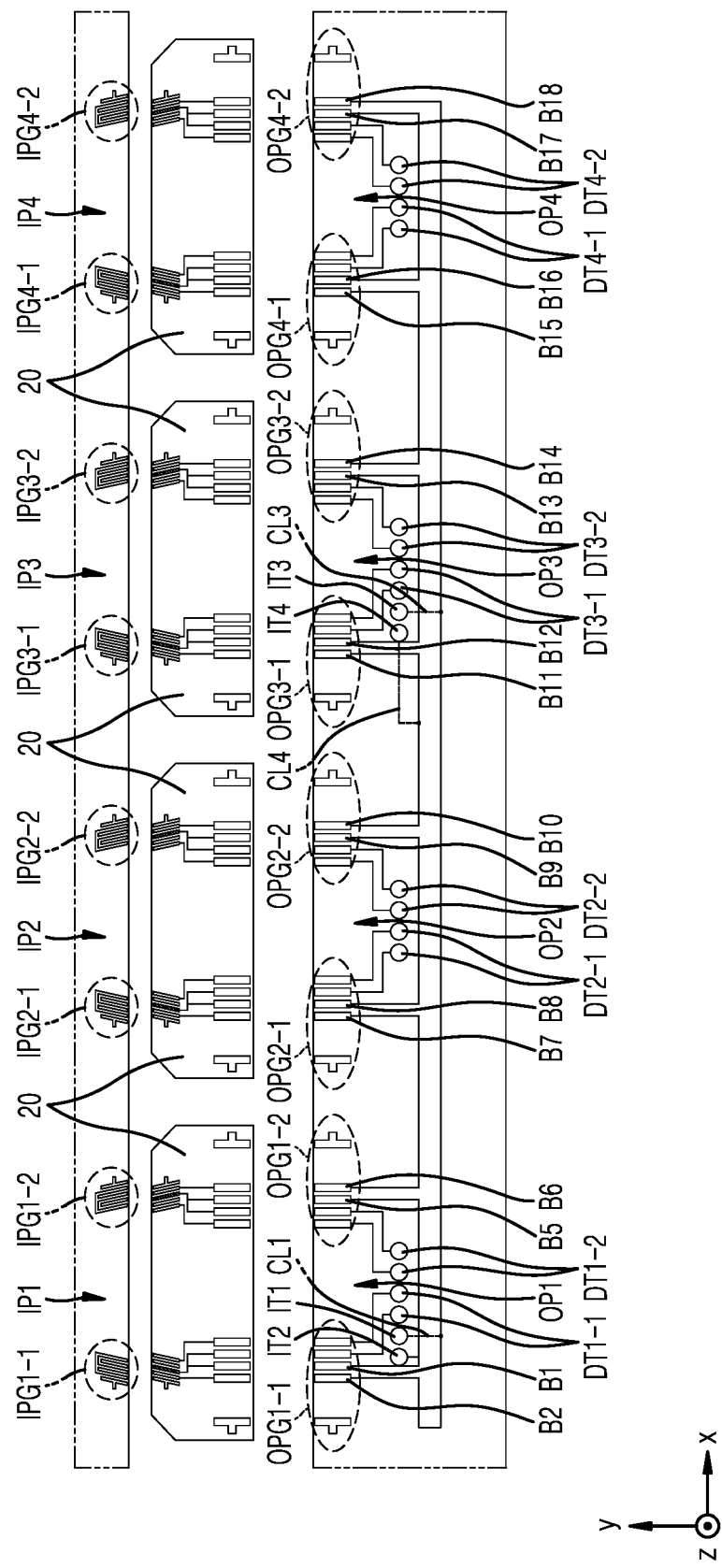
FIG. 11 is an exploded plan view of a portion of a display apparatus according to an embodiment of the present disclosure.

FIG. 11 is an exploded plan view of a portion of a display apparatus according to an embodiment of the present disclosure. A difference between the display apparatus according to the present embodiment and the display apparatus according to the embodiment described above with reference to FIG. 5 is locations of the first input terminal IT1, the second input terminal IT2, the third input terminal IT3, and the fourth input terminal IT4 and connection relationship with other wires. In addition, as shown in FIG. 11, the second test pad B2 and the eighteenth test pad B18 are connected to each other. For example, the second test pad B2 and the eighteenth test pad B18 may be an integral metal pattern.

As shown in FIG. 11, in the case of the display apparatus according to the present embodiment, the first input terminal IT1 and the second input terminal IT2 are adjacent to one side (in the −x direction) of the $1^{st}$-$1^{st}$ test terminal DT1-1. For example, the first input terminal IT1 and the second input terminal IT2 are adjacent to the first output pad unit OP1. The third input terminal IT3 and the fourth input terminal IT4 are adjacent to one side (in the −x direction) of the $3^{rd}$-$1^{st}$ test terminal DT3-1. For example, the third input terminal IT3 and the fourth input terminal IT4 are adjacent to the third output pad unit OP3.

The first input terminal IT1 is electrically connected to the second test pad B2 through a first connection wire CL1, wherein the first connection wire CL1 may be disposed on a layer that is different from a layer on which a wire connecting the first test pad B1 to the fifth test pad B5 is disposed, cross the wire connecting the first test pad B1 to the fifth test pad B5, and be connected, through a contact hole, to a wire connected to the second test pad B2. The first input terminal IT1 and the first connection wire CL1 may also be connected to each other through a contact hole. The second input terminal IT2 is electrically connected to the first test pad B1. For example, the second input terminal IT2, the first test pad B1, and the fifth test pad B5 may be an integral metal pattern. Accordingly, the first input terminal IT1 and the second input terminal IT2 are electrically connected to the $1^{st}$-$1^{st}$ output pad group OPG1-1.

The third input terminal IT3 is electrically connected to the second test pad B2 through the third connection wire CL3, wherein the third connection wire CL3 may be disposed on a layer that is different from a layer on which a wire connecting the twelfth test pad B12 to the 13th test pad B13 is disposed, cross the wire connecting the twelfth test pad B12 to the 13th test pad B13, and be connected, through a contact hole, to a wire connected to the second test pad B2. Accordingly, the third input terminal IT3 may be electrically connected to the first input terminal IT1. The third input terminal IT3 and the third connection wire CL3 may also be connected to each other through a contact hole. The third input terminal IT3 may be electrically connected to the first input terminal IT1 through a wire disposed on a layer that is different from a layer on which the third input terminal IT3 is disposed. The fourth input terminal IT4 is electrically connected to the eleventh test pad B11 through the fourth connection wire CL4, wherein the fourth connection wire CL4 may be disposed on a layer that is different form a layer on which a wire connecting the twelfth test pad B12 to the 13th test pad B13 is disposed, cross the wire connecting the twelfth test pad B12 to the 13th test pad B13, and be connected, through a contact hole, to a wire connecting the tenth test pad B10 to the eleventh test pad B11. Accordingly, the fourth input terminal IT4 may be electrically connected to the $2^{nd}$-$2^{nd}$ output pad group OPG2-2 and the $3^{rd}$-$1^{st}$ output pad group OPG3-1. The fourth input terminal IT4 and the fourth connection wire CL4 may also be connected to each other through a contact hole. For example, the fourth input terminal IT4 may be electrically connected to the $2^{nd}$-$2^{nd}$ output pad group OPG2-2 and the $3^{rd}$-$1^{st}$ output pad group OPG3-1 through a wire disposed on a layer that is different from a layer on which the fourth input terminal IT4 is disposed. The third input terminal IT3 and the fourth input terminal IT4 may be adjacent to the $3^{rd}$-$1^{st}$ output pad group OPG3-1.

In the case of the display apparatus according to the present embodiment as described above, the location of the first input terminal IT1 and the location of the second input terminal IT2 with respect to the first output pad unit OP1 may correspond to the location of the third input terminal IT3 and the location of the fourth input terminal IT4 with respect to the third output pad unit OP3, respectively. Accordingly, connection resistances may be measured while relatively moving the connection jig and the display apparatus using one connection jig JIG. In this case, one connection jig JIG moves only up and down (in the z-axis direction) in place and the display apparatus moves in the +x direction a plurality of times, so that connection resistances in several flexible circuit boards 20 may be effectively measured. As a result, the time required for measuring the connection resistance may be reduced and the difficulty required for measuring the connection resistance may be reduced. However, in this case, arrangement of ten terminals of the connection jig JIG corresponds to locations of the $1^{st}$-$1^{st}$ test terminals DT1-1, the $1^{st}$-$2^{nd}$ test terminals DT1-2, the first input terminal IT1 and the second input terminal IT2 as shown in FIG. 11, and thus may be different from that shown in FIG. 8.

Figure 12:
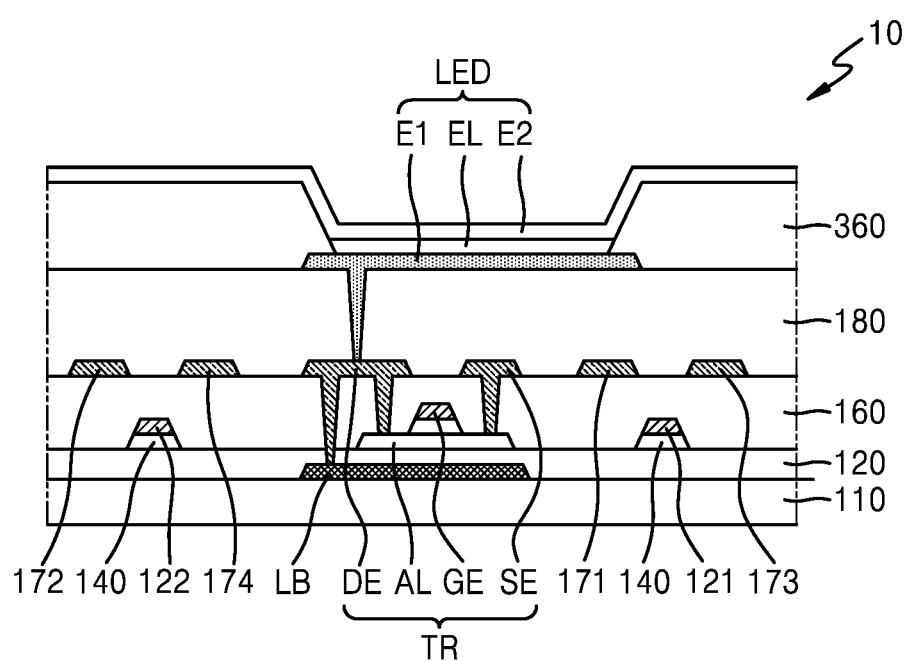
FIG. 12 is a cross-sectional view within a display area of a display panel included in a display apparatus according to an embodiment of the present disclosure.

FIG. 12 is a cross-sectional view within a display area of the display panel 10 included in a display apparatus according to an embodiment of the present disclosure. As shown in FIG. 12, the display panel 10 of the display apparatus includes a substrate 110 and various layers and wires disposed thereon. The substrate 110 may include an insulating material such as glass or plastic. For example, the substrate 110 may have a multilayer structure including two resin layers and an inorganic material layer therebetween.

A light blocking layer LB may be located on the substrate 110. The light blocking layer LB blocks external light from reaching a semiconductor layer AL of a transistor TR, thereby preventing or minimizing deterioration in characteristics of the semiconductor layer AL. The light blocking layer LB may be an electrode to which a specific voltage is applied or a wire that transmits a specific voltage in the display panel 10. The light blocking layer LB may include copper (Cu), aluminum (Al), silver (Ag), chromium (Cr), titanium (Ti), or tantalum (Ta), and may have a single-layer structure or a multi-layer structure.

A barrier layer including an inorganic insulating material such as silicon nitride (SiNx), silicon oxide (SiOx), or silicon nitride oxide (SiOxNy) may be between the substrate 110 and the light blocking layer LB. The barrier layer may have a single-layer structure or a multi-layer structure.

A buffer layer 120 may be located on the light blocking layer LB. The buffer layer 120 may prevent diffusion of impurities from the substrate 110 to the semiconductor layer AL and may planarize an upper surface of the substrate 110. The buffer layer 120 may include an inorganic insulating material such as SiNx, SiOx, or SiOxNy, and may have a single-layer structure or a multi-layer structure.

The semiconductor layer AL may be located on the buffer layer 120. The semiconductor layer AL may include a channel area of the transistor TR and a source area and a drain area on both sides thereof. The semiconductor layer AL may include any one of amorphous silicon, polycrystalline silicon, and an oxide semiconductor. When the semiconductor layer AL includes an oxide semiconductor, the semiconductor layer AL may include at least one of zinc (Zn), indium (In), gallium (Ga), and tin (Sn). For example, the semiconductor layer AL may include Indium-Gallium-Zinc Oxide (IGZO).

A gate insulating layer 140 may be located on the semiconductor layer AL. The gate-insulating layer 140 may include an inorganic insulating material such as SiNx, SiOx, or SiOxNy, and may have a single-layer structure or a multi-layer structure.

A gate conductive layer that may include a gate electrode GE of the transistor TR, the first scan line 121 or the second scan line 122, and the like, may be located on the gate-insulating layer 140. The gate conductive layer may include molybdenum (Mo), aluminum (Al), copper (Cu), or titanium (Ti), and may have a single-layer structure or a multi-layer structure.

An interlayer insulating layer 160 may be located on the gate conductive layer. The interlayer insulating layer 160 may include an inorganic insulating material such as SiNx, SiOx, or SiOxNy, and may have a single-layer structure or a multi-layer structure.

A data conductive layer that may include a source electrode SE and a drain electrode DE of the transistor TR, the data line 171, the driving voltage line 172, the common voltage line 173, or the initialization voltage line 174 may be located on the interlayer insulating layer 160. If necessary, the drain electrode DE may be connected to the light blocking layer LB through a contact hole formed in the interlayer insulating layer 160 and the buffer layer 120. The data conductive layer may include Al, platinum (Pt), palladium (Pd), silver (Ag), magnesium (Mg), gold (Au), nickel (Ni), neodymium (Nd), iridium (Jr), chromium (Cr), calcium (Ca), molybdenum (Mo), Ti, tungsten (W), or copper (Cu), and may have a single-layer structure or a multi-layer structure.

A planarization layer 180 may be located on the data conductive layer. The planarization layer 180 may be an organic layer. For example, the planarization layer 180 may include a general general-purpose polymer such as polymethylmethacrylate or polystyrene, a polymer derivative having a phenolic group, an acrylic polymer, an imide polymer, polyimide, or an organic insulating material such as an acrylic polymer or a siloxane-based polymer.

A passivation layer that may include an inorganic insulating material such as SiNx, SiOx, or SiOxNy may be between the data conductive layer and the planarization layer 180.

A pixel electrode E1 of a light emitting diode LED may be located on the planarization layer 180. The pixel electrode E1 may be connected to the drain electrode DE through a contact hole formed in the planarization layer 180. The pixel electrode E1 may include a reflective conductive material or a semi-transmissive conductive material and may include a transparent conductive material. For example, the pixel electrode E1 may include a transparent conductive material such as indium tin oxide (ITO) or indium zinc oxide (IZO) and may further include a metal or a metal alloy such as lithium (Li), Ca, Al, Ag, Mg, or Au.

A pixel-defining layer 360 having an opening overlapping the pixel electrode E1 may be located on the planarization layer 180. The pixel-defining layer 360 may include an organic insulating material such as an acrylic polymer or an imide polymer.

An emission layer EL may be located on the pixel electrode E1. At least one of a hole injection layer, a hole transport layer, an electron transport layer, and an electron injection layer may be located on the pixel electrode E1 in addition to the emission layer EL.

A common electrode E2 may be located on the emission layer EL. The common electrode E2 may be integrated in several pixels. The common electrode E2 may include a metal or a metal alloy having a low work function, such as calcium (Ca), barium (Ba), magnesium (Mg), aluminum (Al), or silver (Ag), and may be formed as a thin layer and have light transmittance. If necessary, the common electrode E2 may include a transparent conductive oxide such as ITO or IZO.

The light emitting diode LED, such as an organic light emitting diode, is located in each pixel PX, and includes the pixel electrode E1, the emission layer EL, and the common electrode E2 as described above. The pixel electrode E1 may be an anode of the light emitting diode LED, and the common electrode E2 may be a cathode of the light emitting diode LED.

An encapsulation layer may be located on the common electrode E2. The encapsulation layer may be a thin film encapsulation layer in which one or more inorganic layers and one or more organic layers are stacked.

According to an embodiment of the present disclosure as described above, a display apparatus capable of easily confirming electrical coupling states of terminals is provided. However, the scope of the disclosure is not necessarily limited thereto.

Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:
1. A display apparatus, comprising:
 a display panel including a first input pad region, a second input pad region, a third input pad region, and a fourth input pad region;
 a printed circuit board including a first output pad region, a second output pad region, a third output pad region, and a fourth output pad region; and a flexible circuit board including a first end connected to the display panel and a second end connected to the printed circuit board, wherein the first output pad region includes a $1^{st}$-$1^{st}$ output pad group and a $1^{st}$-$2^{nd}$ output pad group, each of the $1^{st}$-$1^{st}$ output pad group and the $1^{st}$-$2^{nd}$ output pad group including a plurality of test pads, wherein one test pad of the $1^{st}$-$1^{st}$ output pad group is connected to one test pad of the $1^{st}$-$2^{nd}$ output pad group, wherein the second output pad region includes a $2^{nd}$-$1^{st}$ output pad group and a $2^{nd}$-$2^{nd}$ output pad group, each of the $2^{nd}$-$1^{st}$ output pad group and the $2^{nd}$-$2^{nd}$ output pad group including a plurality of test pads, wherein one test pad of the $2^{nd}$-$1^{st}$ output pad group is connected to one test pad of the $2^{nd}$-$2^{nd}$ output pad group, wherein the third output pad region includes a $3^{rd}$-$1^{st}$ output pad group and a $3^{rd}$-$2^{nd}$ output pad group, each of the $3^{rd}$-$1^{st}$ output pad group and the $3^{rd}$-$2^{nd}$ output pad group including a plurality of test pads, wherein one test pad of the $3^{rd}$-$1^{st}$ output pad group is connected to one test pad of the $3^{rd}$-$2^{nd}$ output pad group, wherein the fourth output pad region includes a $4^{th}$-$1^{st}$ output pad group and a $4^{th}$-$2^{nd}$ output pad group, each of the $4^{th}$-$1^{st}$ output pad group and the $4^{th}$-$2^{nd}$ output pad group including a plurality of test pads, wherein a test pad of the $4^{th}$-$1^{st}$ output pad group is connected to a test pad of the $4^{th}$-$2^{nd}$ output pad group, and wherein the printed circuit board comprises:
a first input terminal electrically connected to the $1^{st}$-$1^{st}$ output pad group;
a second input terminal electrically connected to the $2^{nd}$-$2^{nd}$ output pad group;
a third input terminal electrically connected to the first input terminal; and
a fourth input terminal electrically connected to the $4^{th}$-$2^{nd}$ output pad group.

2. The display apparatus of claim 1, wherein a location of the first input terminal and a location of the second input terminal with respect to the first output pad region and the second output pad region correspond to a location of the third input terminal and a location of the fourth input terminal with respect to the third output pad region and the fourth output pad region.

3. The display apparatus of claim 1, wherein the third input terminal and the first input terminal are an integral metal pattern.

4. The display apparatus of claim 1, wherein the second input terminal is electrically connected to the $3^{rd}$-$1^{st}$ output pad group.

5. The display apparatus of claim 1, wherein the third input terminal is electrically connected to the first input terminal through a wire disposed on a layer that is different from a layer on which the third input terminal is disposed.

6. The display apparatus of claim 1, wherein the second input terminal is electrically connected to the $3^{rd}$-$1^{st}$ output pad group through a wire disposed on a layer that is different from a layer on which the second input terminal is disposed.

7. The display apparatus of claim 1, wherein the first input terminal is adjacent to the first output pad region, the second input terminal is adjacent to the second output pad region, the third input terminal is adjacent to the third output pad region, and the fourth input terminal is adjacent to the fourth output pad region.

8. The display apparatus of claim 1, wherein the first input terminal and the second input terminal are adjacent to the second output pad region, and the third input terminal and the fourth input terminal are adjacent to the fourth output pad region.

9. The display apparatus of claim 1, wherein a first test pad included in the $1^{st}$-$1^{st}$ output pad group is connected to a test pad included in the $1^{st}$-$2^{nd}$ output pad group, wherein a second test pad included in the $1^{st}$-$2^{nd}$ output pad group is connected to a test pad included in the $2^{nd}$-$1^{st}$ output pad group, wherein a third test pad included in the $2^{nd}$-$1^{st}$ output pad group is connected to a test pad included in the $2^{nd}$-$2^{nd}$ output pad group, wherein a fourth test pad included in the $2^{nd}$-$2^{nd}$ output pad group is connected to a test pad included in the $3^{rd}$-$1^{st}$ output pad group, wherein a fifth test pad included in the $3^{rd}$-$1^{st}$ output pad group is connected to a test pad included in the $3^{rd}$-$2^{nd}$ output pad group, wherein a sixth test pad included in the $3^{rd}$-$2^{nd}$ output pad group is connected to a test pad included in the $4^{th}$-$1^{st}$ output pad group, and wherein a seventh test pad included in the $4^{th}$-$1^{st}$ output pad group is connected to a test pad included in the $4^{th}$-$2^{nd}$ output pad group.

10. The display apparatus of claim 9, wherein the printed circuit board comprises:
$1^{st}$-$1^{st}$ test terminals connected to test pads included in the $1^{st}$-$1^{st}$ output pad group;
$1^{st}$-$2^{nd}$ test terminals connected to test pads included in the $1^{st}$-$2^{nd}$ output pad group;
$2^{nd}$-$1^{st}$ test terminals connected to test pads included in the $2^{nd}$-$1^{st}$ output pad group;
$2^{nd}$-$2^{nd}$ test terminals connected to test pads included in the $2^{nd}$-$2^{nd}$ output pad group;
$3^{rd}$-$1^{st}$ test terminals connected to test pads included in the $3^{rd}$-$1^{st}$ output pad group;
$3^{rd}$-$2^{nd}$ test terminals connected to test pads included in the $3^{rd}$-$2^{nd}$ output pad group;
$4^{th}$-$1^{st}$ test terminals connected to test pads included in the $4^{th}$-$1^{st}$ output pad group; and
$4^{th}$-$2^{nd}$ test terminals connected to test pads included in the $4^{th}$-$2^{nd}$ output pad group.

11. The display apparatus of claim 9, wherein the second input terminal is connected to the fourth test pad included in the $2^{nd}$-$2^{nd}$ output pad group and the test pad included in the $3^{rd}$-$1^{st}$ output pad group.

12. The display apparatus of claim 1, wherein the flexible circuit board comprises:
a first connection pattern electrically connecting the first output pad region to the first input pad region;
a second connection pattern electrically connecting the second output pad region to the second input pad region;
a third connection pattern electrically connecting the third output pad region to the third input pad region; and
a fourth connection pattern electrically connecting the fourth output pad region to the fourth input pad region.

13. A display apparatus, comprising:
a display panel including a first input pad region, a second input pad region, a third input pad region, and a fourth input pad region;
a printed circuit board including a first output pad region, a second output pad region, a third output pad region, and a fourth output pad region; and
a flexible circuit board having a first end connected to the display panel and a second end connected to the printed circuit board, wherein the first output pad region includes a $1^{st}$-$1^{st}$ output pad group and a $1^{st}$-$2^{nd}$ output pad group, each of the $1^{st}$-$1^{st}$ output pad group and the $1^{st}$-$2^{nd}$ output pad group including a plurality of test pads, wherein one test pad of the $1^{st}$-$1^{st}$ output pad group is connected to one test pad of the $1^{st}$-$2^{nd}$ output pad group, wherein the second output pad region includes a $2^{nd}$-$1^{st}$ output pad group and a $2^{nd}$-$2^{nd}$ output pad group, each of the $2^{nd}$-$1^{st}$ output pad group and the $2^{nd}$-$2^{nd}$ output pad group including a plurality of test pads, wherein one test pad of the $2^{nd}$-$1^{st}$ output pad group is connected to one test pad of the $2^{nd}$-$2^{nd}$ output pad group, wherein the third output pad region includes a $3^{rd}$-$1^{st}$ output pad group and a $3^{rd}$-$2^{nd}$ output pad group, each of the $3^{rd}$-$1^{st}$ output pad group and the $3^{rd}$-$2^{nd}$ output pad group including a plurality of test pads, wherein one test pad of the $3^{rd}$-$1^{st}$ output pad group is connected to one test pad of the $3^{rd}$-$2^{nd}$ output pad group, wherein the fourth output pad region includes a $4^{th}$-$1^{st}$ output pad group and a $4^{th}$-$2^{nd}$ output pad group each including a plurality of test pads, wherein one test pad of the $4^{th}$-$1^{st}$ output pad group is connected to one test pad of the $4^{th}$-$2^{nd}$ output pad group, and wherein the printed circuit board comprises:
- a first input terminal and a second input terminal electrically connected to the $1^{st}$-$1^{st}$ output pad group;
- a third input terminal electrically connected to the first input terminal; and
- a fourth input terminal electrically connected to the $3^{rd}$-$1^{st}$ output pad group.

14. The display apparatus of claim 13, wherein a location of the first input terminal and a location of the second input terminal with respect to the first output pad region correspond to a location of the third input terminal and a location of the fourth input terminal with respect to the third output pad region.

15. The display apparatus of claim 13, wherein the third input terminal is electrically connected to the first input terminal through a wire disposed on a layer that is different from a layer on which the third input terminal is disposed.

16. The display apparatus of claim 13, wherein the fourth input terminal is electrically connected to the $3^{rd}$-$1^{st}$ output pad group through a wire disposed on a layer that is different from a layer on which the fourth input terminal is disposed.

17. The display apparatus of claim 16, wherein the fourth input terminal is electrically connected to the $2^{nd}$-$2^{nd}$ output pad group.

18. The display apparatus of claim 13, wherein the first input terminal and the second input terminal are adjacent to the first output pad region, and the third input terminal and the fourth input terminal are adjacent to the third output pad region.

19. The display apparatus of claim 13, wherein a first test pad included in the $1^{st}$-$1^{st}$ output pad group is connected to a test pad included in the $1^{st}$-$2^{nd}$ output pad group, wherein a second test pad included in the $1^{st}$-$2^{nd}$ output pad group is connected to a test pad included in the $2^{nd}$-$1^{st}$ output pad group, wherein a third test pad included in the $2^{nd}$-$1^{st}$ output pad group is connected to a test pad included in the $2^{nd}$-$2^{nd}$ output pad group, wherein a fourth test pad included in the $2^{nd}$-$2^{nd}$ output pad group is connected to a test pad included in the $3^{rd}$-$1^{st}$ output pad group, wherein a fifth test pad included in the $3^{rd}$-$1^{st}$ output pad group is connected to a test pad included in the $3^{rd}$-$2^{nd}$ output pad group, wherein a sixth test pad included in the $3^{rd}$-$2^{nd}$ output pad group is connected to a test pad included in the $4^{th}$-$1^{st}$ output pad group, and wherein a seventh test pad included in the $4^{th}$-$1^{st}$ output pad group is connected to a test pad included in the $4^{th}$-$2^{nd}$ output pad group.

20. The display apparatus of claim 19, wherein the printed circuit board comprises:
- $1^{st}$-$1^{st}$ test terminals connected to test pads included in the $1^{st}$-$1^{st}$ output pad group;
- $1^{st}$-$2^{nd}$ test terminals connected to test pads included in the $1^{st}$-$2^{nd}$ output pad group;
- $2^{nd}$-$1^{st}$ test terminals connected to test pads included in the $2^{nd}$-$1^{st}$ output pad group;
- $2^{nd}$-$2^{nd}$ test terminals connected to test pads included in the $2^{nd}$-$2^{nd}$ output pad group;
- $3^{rd}$-$1^{st}$ test terminals connected to test pads included in the $3^{rd}$-$1^{st}$ output pad group;
- $3^{rd}$-$2^{nd}$ test terminals connected to test pads included in the $3^{rd}$-$2^{nd}$ output pad group;
- $4^{th}$-$1^{st}$ test terminals connected to test pads included in the $4^{th}$-$1^{st}$ output pad group; and
- $4^{th}$-$2^{nd}$ test terminals connected to test pads included in the $4^{th}$-$2^{nd}$ output pad group.

21. The display apparatus of claim 19, wherein the second input terminal is connected to the fourth test pad included in the $2^{nd}$-$2^{nd}$ output pad group and the test pad included in the $3^{rd}$-$1^{st}$ output pad group.

22. The display apparatus of claim 13, wherein the flexible board comprises:
- a first connection pattern electrically connecting the first output pad region to the first input pad region;
- a second connection pattern electrically connecting the second output pad region to the second input pad region;
- a third connection pattern electrically connecting the third output pad region to the third input pad region; and
- a fourth connection pattern electrically connecting the fourth output pad region to the fourth input pad region.

* * * * *